United States Patent [19]
Lam et al.

[11] Patent Number: 5,384,710
[45] Date of Patent: Jan. 24, 1995

[54] CIRCUIT LEVEL NETLIST GENERATION

[75] Inventors: Nim C. Lam, Sunnyvale; Amrit K. Lalchandani, Mountain View, both of Calif.

[73] Assignee: National Semiconductor Corporation, Santa Clara, Calif.

[21] Appl. No.: 173,808

[22] Filed: Dec. 22, 1993

Related U.S. Application Data

[63] Continuation of Ser. No. 493,057, Mar. 13, 1990, abandoned.

[51] Int. Cl.⁶ .............................................. G06F 15/60
[52] U.S. Cl. ..................................... 364/489; 364/488
[58] Field of Search ................. 364/488, 489, 490, 491

[56] References Cited

U.S. PATENT DOCUMENTS

| | | | |
|---|---|---|---|
| 4,635,208 | 1/1987 | Coleby et al. | 364/491 |
| 4,831,543 | 5/1989 | Mastellone | 364/489 |
| 4,922,432 | 5/1990 | Kobayashi et al. | 364/490 |
| 4,967,367 | 10/1990 | Piednoir | 364/489 |
| 5,038,294 | 8/1991 | Arakawa et al. | 364/491 |
| 5,084,824 | 1/1992 | Lam et al. | 364/490 |

OTHER PUBLICATIONS

"Hierarchical Functional Verification for Cell–Based Design Styles" by Chen et al., IEE Proceedings, vol. 134, Part G, No. 2, Apr. 1987, pp. 103–109.
"Programs for Verifying Circuit Connectivity of MOS/LSI Mask Artwork" by Takashima et al., IEEE 19th Design Automation Conf., 1982, pp. 544–550.

*Primary Examiner*—Vincent N. Trans
*Attorney, Agent, or Firm*—H. Donald Nelson; David H. Carroll; Stephen R. Robinson

[57] ABSTRACT

A design layout sequence for an application specific integrated circuit such as a gate array includes a schematic capture step, which results in a logic netlist file, and a placement and routing step which results in a number of various files defining, for example, bias drivers, I/O macros, and relationships between chip pads and I/O signals. The design layout sequence culminates in a physical data base file. The connectivity of this physical data base file is checked by first generating a circuit level netlist file for the entire option, and then comparing the circuit level netlist with the physical data base file. In generating the circuit level netlist file, information is obtained from the logic netlist file, as well as from some of the other files created in the design-layout sequence. In addition, basic information from which the circuit level netlist is constructed is obtained from a skeleton file library and a subcircuit library. The contents and methodology for deriving the skeleton file library and the subcircuit library are discussed.

11 Claims, 53 Drawing Sheets

Microfiche Appendix Included
(483 Microfiche, 6 Pages)

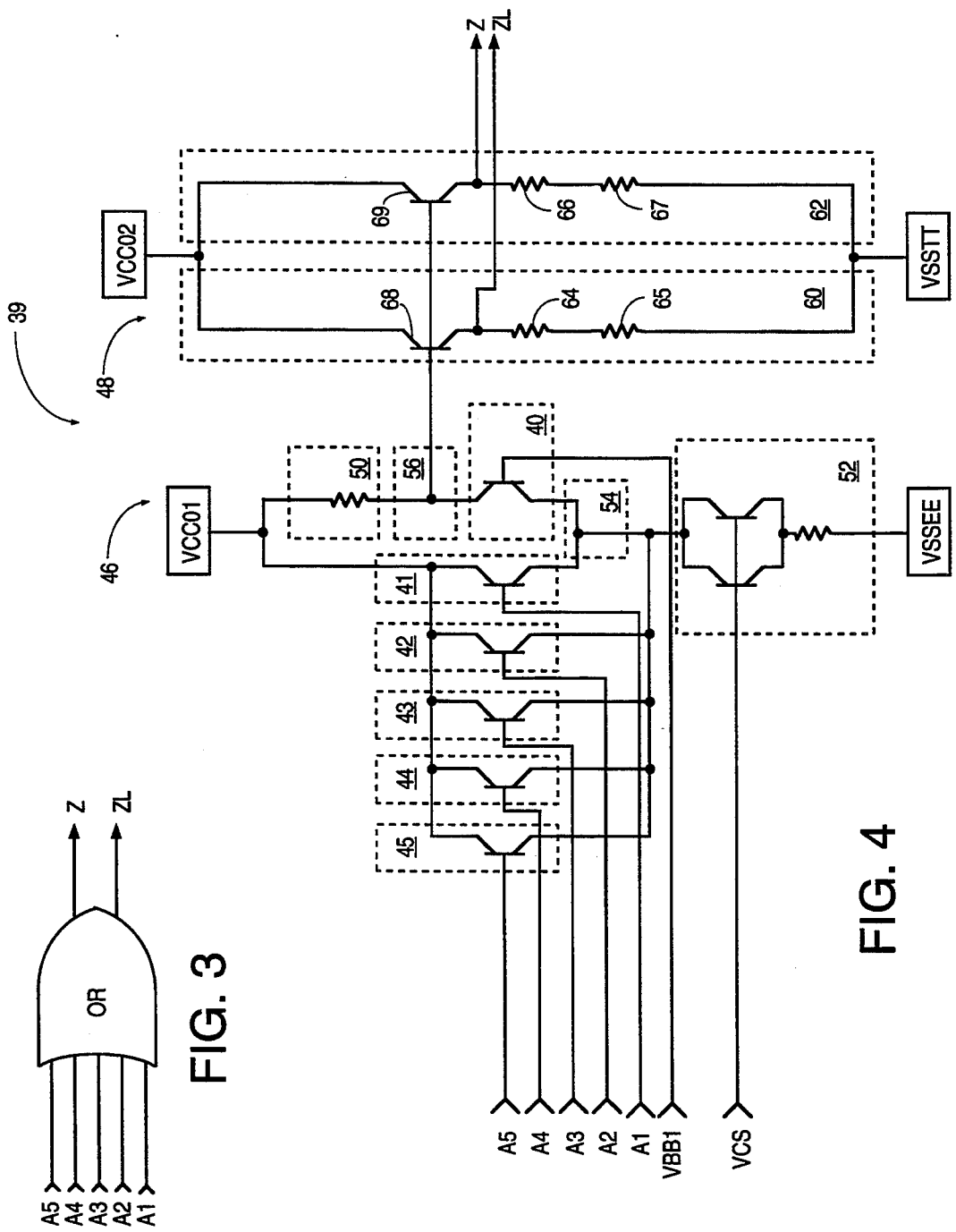

```
NETWORK OR05DL I(A5 A1 VCS VBB1 A2 A3 A4) &
                O(ZL Z) &
                S(VCC01 VCC02 VSSTT VSSEE)
MULTITYPE
        # RQNPN 1                    ⎫
        QNPN $NET2 VBB1 $NET1        ⎬ 40
        # QNPN 1                     ⎫
        QNPN VCC01 A5 $NET1          ⎬ 45
        # QNPN 2                     ⎫
        QNPN VCC01 AI $NET1          ⎬ 41
        # QNPN 3                     ⎫
        QNPN VCC01 A4 $NET1          ⎬ 44
        # QNPN 4                     ⎫
        QNPN VCC01 A3 $NET1          ⎬ 43
        # QNPN 5                     ⎫
        QNPN VCC01 A2 $NET1          ⎬ 42
        # IRLH_1                     ⎫
        IRLH I(VCC01) O($NET2)       ⎬ 50
        # IQOEFL_1                   ⎫
        IQOEFL I($NET2 VCC02) O(Z VSSTT)   ⎬ 60
        # IQOEFL_2                   ⎫
        IQOEFL I($NET2 VCC02) O(ZL VSSTT)  ⎬ 62
        # IQCSH_1                    ⎫
        IQCSH I(VCS $NET1) O(VSSEE)  ⎬ 52

ENDMACRO

DEFINE IRLH I(I) &
              O(O)
MULTITYPE

RP I O    ⎬ 51

ENDMACRO

DEFINE IQCSH I(B C) &
             O(E)
MULTITYPE

RP $NET1 E           ⎫
        QNPN C B $NET1       ⎬ 53
        QNPN C B $NETI       ⎭

ENDMACRO

DEFINE IQOEFL I(B C) &
              O(E1 E)

MULTITYPE

RBASE $NET1 E       ⎫
RBASE EI $NET1      ⎬ 61
QNPN C B E1         ⎭

ENDMACRO
```

FIG. 5

NETWORK OR05DH I(A1 A2 VCS VBB1 A5 A3 A4) &
                          O(ZL Z) &
                          S(VCC01 VCC02 VSSTT VSSEE)
MULTITYPE

RQNPN_1                    ⎫
    QNPN $NET2 VBB1 $NET1       ⎬ 70
    # QNPN_1                     ⎫
    QNPN VCC01 A5 $NET1         ⎬ 75
    # QNPN_2                     ⎫
    QNPN VCC01 A1 $NET1         ⎬ 71
    # QNPN_3                     ⎫
    QNPN VCC01 A4 $NET1         ⎬ 74
    $ QNPN_4                     ⎫
    QNPN VCC01 A3 $NET1         ⎬ 73
    # QNPN_5                     ⎫
    QNPN VCC01 A2 $NET1         ⎬ 72
    # IRLHH_1                    ⎫
    IRLHH I(VCC01) O($NET2)     ⎬ 76
    # IQOEFH_1                   ⎫
    IQOEFH I(VCC02 $NET2) O(VSSTT ZL) ⎬ 78
    # IQOEFH 2                   ⎫
    IQOEFH I(VCC02 $NET2) O(VSSTT Z) ⎬ 80
    # IQCSHH 1                   ⎫
    IQCSHH I(VCS $NET1) O(VSSEE) ⎬ 82

ENDMACRO

DEFINE IRLHH I(I) &
              O(O)
MULTITYPE

RP I O   ⎫
    RP I O   ⎬ 77

ENDMACRO

DEFINE IQCSHH I(B C) &
              O(E)
MULTITYPE

RP $NET1 E        ⎫
    RP $NET1 E        ⎬ 83
    QNPN C B $NET1    ⎪
    QNPN C B $NET1    ⎭

ENDMACRO
DEFINE IQOEFH I(C B) &
              O(E E1)
MULTITYPE
    RBASE E1 E   ⎫
    QNPN C B E1  ⎬ 79
ENDMACRO

FIG. 6

File OR05DL.LSK

```
DEFINE OR05DL I(A5 AI VCS VBB1 A2 A3 A4) &
                        O(ZL Z)
MULTITYPE

# RQNPN_1              ⎫
       QNPN $NET2 VBB1 $NET1  ⎬ 40
       # IRLH_1               ⎫
       IRLH I(VCC) O($NET2)   ⎬ 50
       # IQCSH_1              ⎫
       IQCSH I(VCS $NET1) O(VSSEE) ⎬ 52

ENDMACRO
```

FIG. 7A

File OR05DL.HSK

```
DEFINE OR05DH I(A1 A2 VCS VBB1 A5 A3 A4) &
                        O(ZL Z)
MULTITYPE

#RQNPN_1               ⎫
       QNPN $NET2 VBB1 $NET1  ⎬ 70
       # IRLHH_1              ⎫
       IRLHH I(VCC) O($NET2)  ⎬ 76
       # IQCSHH_1             ⎫
       IQCSHH I(VCS $NET1) O(VSSEE) ⎬ 82

ENDMACRO
```

FIG. 7B

Files OR05D.LA5 and OR05D.HA5

```
# QNPN_1
QNPN VCC A5 $NET1
```

FIG. 7C

Files OR05D.LAI and OR05D.HAI

```
# QNPN_2
QNPN VCC A1 $NET1
```

FIG. 7D

File OR05D.LA4 and OR05D.HA4

```
# QNPN_3
QNPN VCC A4 $NET1
```

FIG. 7E

Files OR05D.LA3 and OR05D.HA3

```
# QNPN_4
QNPN VCC A3 $NET1
```

FIG 7F

Files OR05D.LA2 and OR05D.HA2

```
# QNPN_5
QNPN VCC A2 $NET1
```

FIG 7G

File OR05D.LZ

```
# IQOEFL_1
IQOEFL I($NET2 VCC) O(Z VSSTT)
```

FIG. 7H

File OR05D.LZL

```
# IQOEFL_2
IQOEFL I($NET2 VCC) O(ZL VSSTT)
```

FIG. 7I

File OR05D.HZ

```
# IQOEFH_2
IQOEFH I(VCC $NET2) O(VSSTT Z)
```

FIG. 7J

File OR05D.HZL

```
# IQOEFH_1
IQOEFH I(VCC $NET2) O(VSSTT ZL)
```

FIG. 7K

```
DEFINE IRLH I(I) &
           O(O)
MULTITYPE

RP I O

ENDMACRO                                      50
```

FIG. 8A

```
DEFINE IRLHH I(I) &
            O(O)
MULTITYPE

RP I O
    RP I O
                                              76
ENDMACRO
```

FIG. 8B

```
DEFINE IQCSH I(B C) &
            O(E)
MULTITYPE

RP $NET1 E
    QNPN C B $NET1
    QNPN C B $NET1
                                              52
ENDMACRO
```

FIG. 8C

```
DEFINE IQCSHH I(B C) &
             O(E)

MULTITYPE

RP $NET1 E
    RP $NET1 E
    QNPN C B $NET1
    QNPN C B $NET1                            82

ENDMACRO
```

FIG. 8D

```
DEFINE IQOEFL I(B C) &
         O(E1 E)

MULTITYPE

RBASE $NET1 E
    RBASE E1 $NET1
    QNPN C B E1

ENDMACRO
```

FIG. 8E

```
DEFINE IQOEFH I(C B) &
         O(E E1)

MULTITYPE

RBASE E1 E
    QNPN C B E1

ENDMACRO
```

FIG. 8F

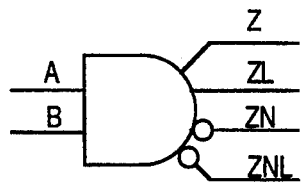

FIG. 10

GADEV8:[DATABASE.MDLS.ANI02]ANI02L.MDL;6

NETWORK ANI02L I(VBB1 A VBB2 B VCS) &
         O(ZN ZNL ZL Z) &
         S(VCC02 VCC01 VCC03 VSSTT VSSEE)
MULTITYPE

Q3
    QNPN $4 VBB2 $2
    # Q4
    QNPN $1 VBB1 $4
    # Q2
    QNPN $5 $6 $2
    # Q1
    QNPN VCC03 B $6
    # IRLL2
    IRLL I(VCC01) O($1)
    # IRLL1
    IRLL I(VCC01) O($3)
    # IQOEFL3
    IQOEFL I($1 VCC02) O(ZL VSSTT)
    # IQOEFL2
    IQOEFL I($3 VCC02) O(ZNL VSSTT)
    # IQOEFL1
    IQOEFL I($3 VCC02) O(ZN VSSTT)
    # IQOEFL4
    IQOEFL I($1 VCC02) O(Z VSSTT)
    # QNPN1
    IQDIFF I(A VBB1 $3 $1) O($5)
    # IQCSL2
    IQCSL I(VCS $2) O(VSSEE)
    # IQCSL1
    IQCSL I(VCS $6) O(VSSEE)

ENDMACRO

FIG. 11A

DEFINE IRLL I(I)
                    O(O)

MULTITYPE

RP $NET1 O
RP I $NET1

ENDMACRO

DEFINE IQOEFL I(B C) &
                    O(EI E)

MULTITYPE

RBASE $NETI E
RBASE EI $NET1
QNPN C B E1

ENDMACRO

DEFINE IQDIFF I(B1 B2 C1 C2) &
                    O(E)
MULTITYPE

QNPN C2 B2 E
QNPN C1 B1 E

ENDMACRO

DEFINE IQCSL I(B C) &
                    O(E)

MULTITYPE

RP $NET1 E
RP $NET2 $NET1
QNPN C B $NET2

ENDMACRO

GADEV8:[DATABASE.MDLS.ANI02]ANI02H.MDL;8

NETWORK ANI02H I(VBB1 A VBB2 B VCS) &
               O(ZL ZNL ZN Z) &
               S(VCC02 VCCO1 VCC03 VSSTT VSSEE)
MULTITYPE

Q3
    QNPN $3 VBB2 $6
    # Q4
    QNPN $1 VBB1 $3
    # Q2
    QNPN $4 $5 $6
    # Q1
    QNPN VCC03 B $5
    # IRLH2
    IRLH I(VCCO1) O($1)
    # IRLHI
    IRLH I(VCCOI) O($2)
    # IQOEFH4
    IQOEFH I(VCC02 $1) O(VSSTT Z)
    # IQOEFH2
    IQOEFH I(VCC02 $2) O(VSSTT ZNL)
    # IQOEFH1
    IQOEFH I(VCC02 $2) O(VSSTT ZN)
    # IQOEFH3
    IQOEFH I(VCC02 $1) O(VSSTT ZL)
    # QNPN1
    IQDIFF I(A VBB1 $2 $1) O($4)
    # IQCSL1
    IQCSL I(VCS $5) O(VSSEE)
    # IQCSH1
    IQCSH I(VCS $6) O(VSSEE)

ENDMACRO

FIG. 12A

```
DEFINE IRLH I(I) &
         O(O)
    MULTITYPE

RP I O

ENDMACRO

DEFINE IQOEFH I(C B) &
           O(E E1)

MULTITYPE

RBASE E1 E
    QNPN C B E1

ENDMACRO

DEFINE IQDIFF I(B1 B2 C1 C2) &
           O(E)
MULTITYPE

QNPN C2 B2 E
    QNPN C1 B1 E

ENDMACRO

DEFINE IQCSL I(B C) &
          O(E)
MULTITYPE

RP $NET1 E
    RP $NET2 $NET1
    QNPN C B $NET2

ENDMACRO

DEFINE IQCSH I(B C) &
          O(E)
MULTITYPE

RP $NET1 E
    QNPN C B $NET1
    QNPN C B $NET1

ENDMACRO
```

FIG. 12B

KEY TO FIG. 12

| FIG. 12A |
| FIG. 12B |

FIG 12

GADEV8:[DATABASE.MDLS.ANI02]ANI02.HA;1

GADEV8:[DATABASE.MDLS.ANI02]ANI02.HB;1

GADEV8:[DATABASE.MDLS.ANI02]ANI02.HSK;3

DEFINE ANI02H I ( VBB1 A VBB2 B VCS ) &
                     O ( ZL ZNL ZN Z )
MULTITYPE

Q3
    QNPN $3 VBB2 $6
    # Q4
    QNPN $1 VBB1 $3
    #Q2
    QNPN $4 $5 $6
    # Q1
    QNPN VCC B $5
    # IRLH2
    IRLH I ( VCC ) O ($1)
    # IRLH1
    IRLH I ( VCC ) O ($20 )
    # QNPN1
    IQDIFF I ( A VBBl $20 $1 ) O ( $4 )
    # IQCSL1
    IQCSL I ( VCS $ 5 ) O (VSSEE )
    # IQCSH1
    IQCSH I (VCS $6 ) O (VSSEE )

ENDMACRO

GADEV8:[DATABASE.MDLS.ANI02]ANI02.HZ;1

IQOEFH4
    IQOEFH I (VCC $1 ) O (VSSTT Z )

GADEV8:[DATABASE.MDLS.ANI02]ANI02.HZL;1

IQOEFH3
    IQOEFH I (VCC $1 ) O (VSSTT ZL )

GADEV8:[DATABASE.MDLS.ANI02]ANI02.HZN;2

IQOEFH1
    IQOEFH I (VCC $20 ) O (VSSTT ZN )

GADEV8:[DATABASE.MDLS.ANI02]ANI02.HZNL;2

IQOEFH2
    IQOEFH I (VCC $20 ) O (VSSTT ZNL )

GADEV8:[DATABASE.MDLS.ANI02]ANI02.LA;1

FIG. 13A

GADEV8: [DATABASE.MDLS.AN102]AN102.LB;1

GADEV8:[DATABASE.MDLS.ANI02]ANI02.LSK;3

DEFINE ANI02L I (VBBI A VBB2 B VCS ) &
          O (ZN ZNL ZL Z )
MULTITYPE

Q3
   QNPN $4 VBB2 $2
   # Q4
   QNPN $1 VBBI $4
   # Q2
   QNPN $5 $6 $2
   # Q1
   QNPN VCC B $6
   # IRLL2
   IRLL I (VCC ) O ($1 )
   # IRLL1
   IRLL I (VCC ) O ($20 )
   # QNPN1
   IQDIFF I (A VBB1 $20 $1 ) O ($5 )
   # IQCSL2
   IQCSL I (VCS $2 ) O (VSSEE )
   # IQCSL1
   IQCSL I (VCS $6 ) O (VSSEE )

ENDMACRO

GADEV8:[DATABASE.MDLS.ANI02]ANI02.LZ;1

IQOEFL4
   IQOEFLX I (VCC $1 ) O ( VSSTT Z)

GADEV8:[DATABASE.MDLS.ANI02]ANI02.LZL;1

IQOEFL3
   IQOEFLX I (VCC $1 ) O ( VSSTT ZL)

GADEV8:[DATABASE.MDLS.ANI02]ANI02.LZN;1

IQOEFL1
   IQOEFLX I (VCC $20 ) O ( VSSTT ZN)

GADEV8:[DATABASE.MDLS.ANI02]ANI02.LZNL;1

IQOEFL2
   IQOEFLX I (VCC $20 ) O ( VSSTT ZNL)

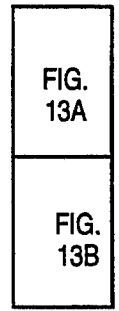

KEY TO FIG 13

GADEV8:[DATABASE.MDLS.MXI04]MXI04L.MDL;5

NETWORK MXI04L I(EN S1 I3 I2 VBB1 VBB2 VCS S0 I0 I1) &
      O(ZL Z ZN ZNL) &
      S(VCC03 VCC01 VCC02 VSSEE VSSTT)
MULTITYPE

RP_1
  RP $NET18 VSSEE
  # QNPN_1
  QNPN $NET10 VCS $NET18
  # QNPN_2

```
QNPN $NET9 EN $NET12
# QNPN_3
QNPN $NET9 EN $NET13
# QNPN_4
QNPN VCC03 S1 $NET10
# QNPN_5
QNPN $NET13 $NET10 $NET14
# QNPN_6
QNPN $NET12 VBB2 $NET14
# QNPN_7
QNPN $NET5 $NETI $NET7
# QNPN_8
QNPN $NET6 VBB2 $NET7
# QNPN_9
QNPN $NET16 VBB2 $NET15
# QNPN_10
QNPN $NET17 $NETI $NET15
# IQCSHI
QNPN $NETI VCS $NET18
# Q1
QNPN VCC03 S0 $NETI
# IRLL_1
IRLL I(VCCOI) O($NET2)
# IRLL_2
IRLL I(VCCOI) O($NET3)
# IRLL_3
IRLL I(VCCOI) O($NET9)
# IRLL_4
IRLL I(VCCOI) O($NET8)
# IQOEFL_1
IQOEFL I($NET8 VCC02) O(ZN VSSTT)
# IQOEFL_2
IQOEFL I($NET8 VCC02) O(ZNL VSSTT)
# IQOEFL_3
IQOEFL I($NET9 VCC02) O(Z VSSTT)
# IQOEFL_4
IQOEFL I($NET9 VCC02) O(ZL VSSTT)
# IQOEFL_5
IQOEFL I($NET3 VCC02) O($NET4 VSSTT)
# IQOEFL3
IQOEFL I($NET2 VCC02) O($NET11 VSSTT)
# IQDIFF_1
IQDIFF I(VBB1 $NET4 $NET8 $NET9) O($NET13)
# IQDIFF_2
IQDIFF I(VBB1 $NET11 $NET8 $NET9) O($NET12)
# IQDIFF 3
IQDIFF I(VBB1 I3 VCC01 $NET3) O($NET5)
# IQDIFF_4
IQDIFF I(VBB1 I2 VCC01 $NET3) O($NET6)
# IQDIFF2
IQDIFF I(VBB1 IO VCC03 $NET2) O($NET16)
```

FIG. 15B

```
# IQDIFF1
IQDIFF I(VBB1 I1 VCC03 $NET2) O($NET17)
# IQCSL_1
IQCSL I(VCS $NET14 ) O(VSSEE)
# IQCSL 2
IQCSL I(VCS $NET7 ) O(VSSEE)
# IQCSH2
IQCSL I(VCS $NET15) O(VSSEE)

ENDMACRO

DEFINE IRLL I(I) &
            O(O)
MULTITYPE
                  130
    RP $NET1 O
    RP I $NET1

ENDMACRO

DEFINE IQOEFL I(B C) &
            O(E1 E)
MULTITYPE

RBASE $NET1 E
    RBASE E1 $NET1
    QNPN C B E1

ENDMACRO

DEFINE IQDIFF I(B2 B1 C2 C1) &
            O(E)
MULTITYPE
                              132
    QNPN C2 B2 E
    QNPN C1 B1 E

ENDMACRO

DEFINE IQCSL I(B C) &
            O(E)
MULTITYPE

RP $NET1 E
    RP $NET2 $NET1
    QNPN C B $NET2

ENDMACRO
```

KEY TO FIG. 14, 15

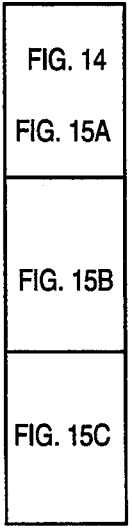

GADEV8:[DATABASE.MDLS.MXI04]MXI04H.MDL;6

NETWORK MXI04H I(EN S1 I3 I2 VBB1 VBB2 VCS S0 I0 I1) &
           O(ZL Z ZN ZNL) &
           S(VCC03 VCC01 VCC02 VSSEE VSSTT)

MULTITYPE
  # RP_1
  RP $NET1 VSSEE
  # QNPN_1
  QNPN $NET18 VCS $NET1
  # QNPN_2
  QNPN $NET3 EN $NET6
  # QNPN_3
  QNPN $NET3 EN $NET7
  # QNPN_4
  QNPN VCC03 S1 $NET18
  # QNPN_5
  QNPN $NET7 $NET18 $NET9
  # QNPN_6
  QNPN $NET6 VBB2 $NET9
  # QNPN_7
  QNPN $NET11 $NET8 $NET13
  # QNPN_8
  QNPN $NET12 VBB2 $NET13
  # QNPN_9
  QNPN SNET15 VBB2 $NET14
  # QNPN_10
  QNPN $NET16 $NET8 $NET14
  # IQCSH1
  QNPN $NET8 VCS $NET1
  # Q1
  QNPN VCC03 S0 $NET8
  # IRLH_1
  IRLH I(VCC01) O($NET3)
  # IRLH_2
  IRLH I(VCC01) O($NET2)
  # IRLH_3
  IRLH I(VCCOl) O($NET10)
  # IRLH1
  IRLH I(VCC01) O($NET17)
  # IQOEFL_1
  IQOEFL I($NETIO VCC02) O($NET5 VSSTT)
  # IQOEFL3
  IQOEFL I($NET17 VCC02) O($NET4 VSSTT)
  # IQOEFH_1
  IQOEFH I(VCC02 $NET2) O(VSSTT ZN)
  # IQOEFH_2
  IQOEFH I(VCC02 $NET2) O(VSSTT ZNL)
  # IQOEFH_3
  IQOEFH I(VCC02 $NET3) O(VSSTT Z)
  # IQOEFH_4
  IQOEFH I(VCC02 $NET3) O(VSSTT ZL)

FIG. 16A

```
                    IQDIFF_1
                    IQDIFF I(VBB1 $NET5 $NET2 $NET3) O($NET7)
                  # IQDIFF_2
                    IQDIFF I(VBB1 $NET4 $NET2 $NET3) O($NET6)
                  # IQDIFF_3
                    IQDIFF I(VBB1 I3 VCC01 $NET10) O($NET11)
                  # IQDIFF_4
                    IQDIFF I(VBB1 I2 VCC01 $NET10) O($NET12)
                  # IQDIFF2
                    IQDIFF I(VBB1 I0 VCC03 $NET17) O($NET15)
                  # IQDIFF1
                    IQDIFF I(VBB1 I1 VCC03 $NET17) O($NET16)
                  #IQCSH_1
                    IQCSH I(VCS $NET9) O(VSSEE)
                  # IQCSH_2
                    IQCSH I(VCS $NET13) O(VSSEE)
                  # IQCSH2
                    IQCSH I(VCS $NET14) O(VSSEE)

ENDMACRO

DEFINE IRLH I(I) &
                O(O)
MULTITYPE

RP I O

ENDMACRO

DEFINE IQOEFL I(B C) &
                O(E1 E)
MULTITYPE

RBASE $NET1 E
        RBASE E1 $NET1
        QNPN C B E1

ENDMACRO

DEFINE IQOEFH I(C B) &
                O(E E1)
MULTITYPE

RBASE E1 E
        QNPN C B E1

ENDMACRO

DEFINE IQDIFF I(B2 B1 C2 C1) &
                O(E)
MULTITYPE
```

FIG. 16B

```
        QNPN C2 B2 E
        QNPN C1 BI E
ENDMACRO

DEFINE IQCSH I(B C) &
              O(E)
MULTITYPE

RP $NET1 E
        QNPN C B $NET1
        QNPN C B $NET1

ENDMACRO
```

KEY TO FIG. 16

GADEV8:[DATABASE.MDLS.MXI04]MXI04.HEN;1

QNPN_2
    QNPN $NET30 EN $NET60
    # QNPN_3
    QNPN $NET30 EN $NET70

GADEV8:[DATABASE.MDLS.MXI04]MXI04.HI0;1

GADEV8:[DATABASE.MDLS.MXI04]MXI04.HI1;1

GADEV8:[DATABASE.MDLS.MXI04]MXI04.HI2;1

GADEV8:[DATABASE.MDLS.MXI04]MXI04.HI3;1

GADEV8:[DATABASE.MDLS.MXI04]MXI04.HS0;1

GADEV8:[DATABASE.MDLS.MXI04]MXI04.HS1;1

GADEV8:[DATABASE.MDLS.MXI04]MXI04.HSK;6

DEFINE MXI04H I (EN S1 I3 I2 VBB1 VBB2 VCS S0 I0 I1 ) &
                            O (ZL Z ZN ZNL )
MULTITYPE

RFIX1
    RP $NET1 $NN10

RP_1
    RP $NET1 VSSEE
    # QNPN_1
    QNPN $NET18 VCS $NET1
    # QNPN_4
    QNPN VCC S1 $NET18
    # QNPN_5
    QNPN $NET70 $NET18 $NET9
    # QNPN_6
    QNPN $NET60 VBB2 $NET9
    # QNPN_7
    QNPN $NET11 $NET8 $NET13
    # QNPN_8
    QNPN $NET12 VBB2 $NET13
    # QNPN_9
    QNPN $NET15 VBB2 $NET14
    # QNPN_10
    QNPN $NET16 $NET8 $NET14
    # IQCSH1
    QNPN $NET8 VCS $NET1
    # Q1
    QNPN VCC S0 $NET8
    # IRLH_1
    #IRLR I (VCC ) O ($NET30 )

FIG. 17A

```
# IRLH_2
IRLH I (VCC ) O ($NET25)
# IRLH_3
IRLH I (VCC ) O ($NET10 )
# IRLH1
IRLH I (VCC ) O ($NET17 )
# IQOEFL_1
IQOEFL I ($NET10 VCC ) O ($NET5 VSSTT )
# IQOEFL3
IQOEFL I ($NET17 VCC ) O ($NET4 VSSTT )
# IQDIFF_1
IQDIFF I (VBB1 $NET5 $NET25 $NET30 ) O ($NET70 )
# IQDIFF_2
IQDIFF I (VBB1 $NET4 $NET25 $NET30 ) O ($NET60 )
# IQDIFF_3
IQDIFF I (VBB1 I3 VCC $NET10 ) O ($NET11 )
# IQDIFF_4
IQDIFF I (VBB1 I2 VCC $NET10 ) O ($NET12 )
# IQDIFF2
IQDIQFF I (VBB1 I0 VCC $NET17 ) O ($NET15 )
#IQDIFF1
IQDIFF I (VBB1 I1 VCC $NET17 ) O ($NET16 )
# IQCSH_1
IQCSH I (VCS $NET9 ) O (VSSEE )
# IQCSH_2
IQCSH I (VCS $NET13 ) O (VSSEE )
# IQCSH2
IQCSH I (VCS $NET14 ) O (VSSEE )

ENDMACRO

GADEV8:[DATABASE.MDLS.MXI04]MXI04.HZ;1

# IQOEFH_3
    IQOEFH I (VCC $NET30 ) O (VSSTT Z )

GADEV8:[DATABASE.MDLS.MXI04]MXI04.HZL;1

# IQOEFH_4
    IQOEFH I (VCC $NET30 ) O (VSSTT ZL )

GADEV8:[DATABASE.MDLS.MXI04]MXI04.HZN;1

# IQOEFH 1
    IQOEFH I (VCC $NET25) 0 (VSSTT ZN )

GADEV8:[DATABASE.MDLS.MXI04]MXI04.HZNL;1

# IQOEFH_2
    IQOEFH I (VCC $NET25) 0 (VSSTT ZNL )

GADEV8:[DATABASE.MDLS.MXI04]MXI04.LEN;1
```

FIG. 17B

```
# QNPN_2
QNPN $NET30 EN $NET60
# QNPN_3
QNPN $NET30 EN $NET70
```

GADEV8:[DATABASE.MDLS.MXI04]MXI04.LI0;1

GADLV8:[DATABASE.MDLS.MXI04]MXI04.LI1;1

GADEV8:[DATABASE.MDLS.MXI04]MXI04.LI2;1

GADEV8:[DATABASE.MDLS.MXI04]MXI04.LI3;1

GADEV8:[DATABASE.MDLS.MXI04]MXI04.LS0;1

GADEV8:[DATABASE.MDLS.MXI04]MXI04.LS1;1

GADEV8:[DATABASE.MDLS.MXI04]MXI04.LSK;4

```
DEFINE MXI04L I (EN S1 I3 I2 VBB1 VBB2 VCS S0 I0 I1 ) &
                            O (ZL Z ZN ZNL )
MULTITYPE

RFIX1
        RP $NET18 $NN10

# RP 1
        RP $NET18 VSSEE
        # QNPN_1
        QNPN $NET10 VCS $NET18
        # QNPN_4
        QNPN VCC S1 $NET10
        # QNPN_5
        QNPN $NET70 $NET10 $NET14
        # QNPN_6
        QNPN $NET60 VBB2 $NET14
        # QNPN_7
        QNPN $NET5 $NET1 $NET7
        # QNPN_8
        QNPN $NET6 VBB2 $NET7
        # QNPN_9
        QNPN $NET16 VBB2 $NET15
        # QNPN_10
        QNPN $NET17 $NET1 $NET15
        # IQCSH1
        QNPN $NET1 VCS $NET18
        # Q1
        QNPN VCC S0 $NET1
        # IRLL_1
        IRLL I (VCC ) O ($NET2 )
        # IRLL_2
        IRLL I (VCC ) O ($NET3 )
        # IRLL_3
```

FIG. 17C

```
            IRLL I (VCC) O ($NET30)
          # IRLL_4
            IRLL I (VCC) O ($NET25)
          # IQOEFL_5
            IQOEFL I ($NET3 VCC) O ($NET4 VSSTT)
          # IQOEFL3
            IQOEFL I ($NET2 VCC) O ($NET11 VSSTT)
          # IQDIFF_1
            IQDIFF I (VBB1 $NET4 $NET25 $NET30) O ($NET70)
          # OQDIFF_2
            IQDIFF I (VBB1 $NET11 $NET25 $NET30) O ($NET60)
          # IQDIFF_3
            IQDIFF I (VBBI I3 VCC $NET3) O ($NET5)
          # IQDIFF_4
            IQDIFF I (VBBI I2 VCC $NET3) O ($NET6)
          # IQDIFF2
            IQDIFF I (VBBI I0 VCC $NET2) O ($NET16)
          # IQDIFF1
            IQDIFF I (VBB1 I1 VCC $NET2) O ($NET17)
          # IQCSL_1
            IQCSL I (VCS $NET14) O (VSSEE)
          # IQCSL_2
            IQCSL I (VCS $NET7) O (VSSEE)
          # IQCSH2
            IQCSL I (VCS $NET15) O (VSSEE)

ENDMACRO

GADEV8:[DATABASE.MDLS.MXI04]MXI04.LZ;1

# IQOEFL_3
            IQOEFL I ($NET30 VCC) O (Z VSSTT)

GADEV8:[DATABASE.MDLS.MXI04]MXI04.LZL;1

# IQOEFL_4
            IQOEFL I ($NET30 VCC) O (ZL VSSTT)

GADEV8:[DATABASE.MDLS.MXI04]MXI04.LZN;1

# IQOEFL_1
            IQOEFL I ($NET25 VCC) O (ZN VSSTT)

GADEV8:[DATABASE.MDLS.MXI04]MXI04.LZNL;1

# IQOEFL_2
            IQOEFL I ($NET25 VCC) O (ZNL VSSTT)
```

KEY TO FIG. 17

GADEV8:[DATABASE.MDLS.OR250X2]OR250X2H.MDL;9

NETWORK OR250X2 I(VCSE VBB1I A2 A1) &
                                  O(FZ) &
                                  S(VCC01 VCCA VSSEE)

MULTITYPE

RCS2
    RP $2 VSSEE
    # RCS1
    RP $3 VSSEE
    # R5MA_1
    R5MA I(VCC01) O($15 $14)
    # Q4
    QNPN VCC01 VBB1I $6
    # Q2
    QNPN $5 VCSE $3
    # Q5
    QNPN $6 VCSE $2
    # Q3
    QNPN VCC01 A2 $5
    # Q1
    QNPN VCC01 A1 $5
    # Q5MA_1
    Q5MA I($15 VCSE $6 $5 $14) O(VSSEE)
    # Q6
    IOQNPN I(VCCA $14) O(FZ)
    # 5DIO_1
    5DIO I(14) O($15)

ENDMACRO

```
DEFINE R5MA I(VCC) &
         O(A B)
MULTITYPE

RBL VCC B
    RBL VCC A

ENDMACRO

DEFINE Q5MA I(C VCS B A D) &
         O(VEE)
MULTITYPE

QNPN D B $NET1
    RBL $NET2 VEE
    QNPN $NET1 VCS $NET2
    QNPN C A $NET1

ENDMACRO

DEFINE IOQNPN I(C B) &
         O(E)
MULTITYPE

QNPN C B E
    QNPN C B B

ENDMACRO

DEFINE 5DIO I(I) &
         O(O)
MULTITYPE

RBL I $NET1
    DIODE O $NET1

DIODE $NET1 O
    DIODE $NETB $NET1
    DIODE $NETA O

ENDMACRO
```

} 134

KEY TO FIG. 18, 19

FIG. 18, FIG 19A-B

GADEV8:[DATABASE.MDLS.OR25OX2]OR25OX2.HAL;2

Q1
QNPN VCC A1 $5

GADEVB:[DATABASE.MDLS.OR250X2]OR250X2.HA2;2

Q3
QNPN VCC A2 $5

GADEV8:[DATABASE.MDLS.OR2SOX2]OR250X2.HSK;5

DEFINE OR250X2 I(VCSE VBB1I A2 A1) &
                 O(FZ)
MULTITYPE

RCS2
RP $2 VSSEE
RCS1
RP $3 VSSEE
R5MA_1
R5MA I(VCC) O($15 $14)
Q4
QNPN VCC VBB1I $6
Q2
QNPN $5 VCSE $3
Q5
QNPN $6 VCSE $2
Q5MA_1
Q5MA I($15 VCSE $6 $5 $14) O(VSSEE)
Q6
IOQNPN I(VCC $14) O(FZ)
5DI0_1
5DIO I($14) O($15)

ENDMACRO

GADEV8:[DATABASE.MDLS.OR250X2]OR250X2.NA1;2

Q1
QNPN VCC $A1 $5

GADEV8:[DATABASE.MDLS.OR250X2]OR250X2.NA2;2

Q3
QNPN VCC $A2 $5

FIG. 20

GADEV8:[DATABASE.MDLS.DFI04]DFI04L.MDL;5

NETWORK DFI04L I(VBB1 D CP VBB2 VCS) &
                                    O(QN Q) &
                                    S(VCC02 VCC03 VCC01 VSSTT VSSEE)

MULTITYPE

RFIX1
    RP $1 $NN1
    # RFIX2
    RP $17 $NN2

RSK2
    RN $8 $3
    # RSK1
    RN $18 $19
    # Q5
    QNPN $9 VBB2 $3
    # Q3
    QNPN $16 VBB2 $19
    # Q4
    QNPN $10 $4 $8
    # Q2
    QNPN $17 $4 $18
    # Q1
    QNPN VCC03 CP $4
    # IRLH4
    IRLH I(VCC01) O($5)
    # IRLH3
    IRLH I(VCC01) O($11)
    # IRLH2
    IRLH I(VCC01) O($14)
    # IRLH1
    IRLH I(VCC01) O($15)

```
            # IQOEFL6
            IQOEFL I($5 VCC02) O(QN VSSTT)
            # IQOEFL4
            IQOEFL I($5 VCC02) O($26 VSSTT)
            # IQOEFL5
            IQOEFL I($11 VCC02) O(Q VSSTT)
            # IQOEFL3
            IQOEFL I($11 VCC02) O($27 VSSTT)
            # IQOEFL2
            IQOEFL I($15 VCC02) O($25 VSSTT)
            # IQOEFL1
            IQOEFL I($14 VCC02) O($24 VSSTT)
            # IQDIFF4
            IQDIFF I($27 $26 $5 $11) O($9)
            # IQDIFF3
            IQDIFF I($25 $24 $5 $11) O($10)
            # IQDIFF2
            IQDIFF I(D VBB1 $14 $15) 0($16)
            # IQDIFF1
            IQDIFF I($25 $24 $14 $15) O($17)
            # IQCSH3
            IQCSH I(VCS $3) O(VSSEE)
            # IQCSH2
            IQCSH I(VCS $18) O(VSSEE)
            # IQCSH1
            IQCSH I(VCS $4) O(VSSEE)

ENDMACRO

DEFINE IRLH I(I) &
                O(O)
MULTITYPE

RP I O

ENDMACRO

DEFINE IQOEFL I(B C) &
                O(E1 E)
MULTITYPE

RBASE $NET1 E
        RBASE E1 $NET1
        QNPN C B E1

ENDMACRO

DEFINE IQDIFF I(B2 B1 C2 C1) &
                O(E)
MULTITYPE
```

FIG. 22B

```
QNPN C2 B2 E
QNPN C1 B1 E

ENDMACRO

DEFINE IQCSH I(B C) &
              O(E)
MULTITYPE

RP $NET1 E
    QNPN C B $NET1
    QNPN C B $NET1
```

KEY TO FIG. 21, 22

FIG. 21, FIG 22A-C

GADEV8:[DATABASE.MDLS.DFI04]DFI04H.MDL;4

NETWORK DFI04H I(VBB1 D CP VBB2 VCS) &
      O(QN Q) &
      S(VCC02 VCC03 VCC01 VSSTT VSSEE)
MULTITYPE

RFIX1
 RN $1 $NN1
 # RFIX2
 RN $17 $NN2

RSK2
 RN $6 $1
 # RSK1
 RN $16 $17
 # Q5
 QNPN $7 VBB2 $1
 # Q3
 QNPN $14 VBB2 $17
 # Q4
 QNPN $8 $2 $6
 # Q2
 QNPN $15 $2 $16
 # Q1

QNPN VCC03 CP $2
 # IRLH4
 IRLH I(VCC01) O($3)
 # IRLH3
 IRLH I(VCC01) O($9)
 # IRLH2
 IRLH I(VCC01) O($26)
 # IRLH1
 IRLH I(VCC01) O($13)
 # IQOEFL4
 IQOEFL I($3 VCC02) O($24 VSSTT)
 # IQOEFL3
 IQOEFL I($9 VCC02) O($25 VSSTT)
 # IQOEFL2
 IQOEFL I($13 VCC02) O($22 VSSTT)
 # IQOEFL1
 IQOEFL I($26 VCC02) O($23 VSSTT)
 # IQOEFH2
 IQOEFH I(VCC02 $3) O(VSSTT QN)
 # IQOEFH1
 IQOEFH I(VCC02 $9) O(VSSTT Q)
 # IQDIFF4
 IQDIFF I($25 $24 $3 $9) O($7)
 # IQDIFF3

FIG. 23A

```
        IQDIFF I($22 $23 $3 $9) O($8)
        # IQDIFF2
        IQDIFF I(D VBB1 $26 $13) O($14)
        # IQDIFF1
        IQDIFF I($22 $23 $26 $13) O($15)
        # IQCSH3
        IQCSH I(VCS $1) O(VSSEE)
        # IQCSH2
        IQCSH I(VCS $16) O(VSSEE)
        # IQCSH1
        IQCSH I(VCS $2) O(VSSEE)

ENDMACRO

DEFINE IRLH I(I) &
            O(O)
MULTITYPE

RP I O

ENDMACRO

DEFINE IQOEFL I(B C) &
            O(E1 E)
MULTITYPE

RBASE $NET1 E
        RBASE E1 $NET1
        QNPN C B E1

ENDMACRO

DEFINE IQOEFH I(C B) &
            O(E E1)
MULTITYPE

RBASE E1 E
        QNPN C B E1

ENDMACRO

DEFINE IQDIFF I(B2 B1 C2 C1) &
            O(E)
MULTITYPE

QNPN C2 B2 E
        QNPN C1 B1 E

ENDMACRO

DEFINE IQCSH I(B C) &
            O(E)
MULTITYPE
```

FIG. 23B

RP $NET1 E
QNPN C B $NET1
QNPN C B $NET1

ENDMACRO

KEY TO FIG. 23

GADEV8:[DATABASE.MDLS.DFI04]DFI04.HCP;1

GADEV8:[DATABASE.MDLS.DFI04]DFI04.HD;1

GADEV8:[DATABASE.MDLS.DFI04]DFI04.HQ;1

IQOEFH1
    IQOEFH I ( VCC $60 ) O ( VSSTT Q )

GADEV8:[DATABASE.MDLS.DFI04]DFI04.HQN;1

IQOEFH2
    IQOEFH I ( VCC $50 ) O ( VSSTT QN )

GADEV8:[DATABASE.MDLS.DFI04]DFI04.HSK;5

DEFINE DFI04H I ( VBB1 D CP VBB2 VCS ) &
                          O ( QN Q )
MULTITYPE

RFIX1
    RN $1 $NN1
    # RFIX2
    RN $17 $NN2

RSK2
    RN $6 $1
    # RSK1
    RN $16 $17
    # Q5
    QNPN $7 VBB2 $1
    # Q3
    QNPN $14 VBB2 $17
    # Q4
    QNPN $8 $2 $6
    # Q2
    QNPN $15 $2 $16
    # Q1
    QNPN VCC CP $2
    # IRLH4
    IRLH I ( VCC ) O ( $50 )
    # IRLH3
    IRLH I ( VCC ) O ( $60 )
    # IRLH2
    IRLH I ( VCC ) O ( $26 )
    # IRLH1
    IRLH I ( VCC ) O ( $13 )
    # IQOEFL4
    IQOEFL I ( $50 VCC ) O ( $24 VSSTT )
    # IQOEFL3
    IQOEFL I ( $60 VCC ) O ( $25 VSSTT )

FIG. 24A

```
            # IQOEFL2
            IQOEFL I ($13 VCC ) O ($22 VSSTT )
            # IQOEFL1
            IQOEFL I ($26 VCC ) O ($23 VSSTT )
            # IQDIFF4
            IQDIFF I ($25 $24 $50 $60 ) O ($7 )
            # IQDIFF3
            IQDQIFF I ($22 $23 $50 $60 ) O ($8 )
            # IQDIFF2
            IQDIFF I (D VBB1 $26 $13 ) O ($14 )
            # IQDIFF1
            IQDIFF I ($22 $23 $26 $13 ) O ($15 )
            # IQCSH3
            IQCSH I (VCS $1 ) O (VSSEE )
            # IQCSH2
            IQCSH I (VCS $16 ) O (VSSEE )
            # IQCSH1
            IQCSH I (VCS $2 ) O (VSSEE )

ENDMACRO

GADEV8:[DATABASE.MDLS.DFI04]DFI04.LCP;1

GADEV8:[DATABASE.MDLS.DFI04]DFI04.LD;1

GADEV8:[DATABASE.MDLS.DFI04]DFI04.LQ;1

# IQOEFL5
            IQOEFLX I (VCC $60 ) O ( VSSTT Q)

GADEV8:[DATABASE.MDLS.DFI04]DFI04.LQN;1

# IQOEFL6
            IQOEFLX I (VCC $50 ) O ( VSSTT QN)

GADEV8:[DATABASE.MDLS.DFI04]DFI04.LSK;5

DEFINE DFI04L I (VBB1 D CP VBB2 VCS ) &
                                  O (QN Q )
MULTITYPE

RFIX1
            RP $1 $NN1
            # RFIX2
            RP $17 $NN2
            # RSK2
            RN $8 $3
            # RSK1
            RN $18 $19
            # Q5
            QNPN $9 VBB2 $3
            # Q3
```

```
           QNPN $16 VBB2 $19
         # Q4
           QNPN $10 $4 $8
         # Q2
           QNPN $17 $4 $18
         # Q1
           QNPN VCC CP $4
         # IRLH4
           IRLH I (VCC) O ($50)
         # IRLH3
           IRLH I (VCC) O ($60)
         # IRLH2
           IRLH I (VCC) O ($14)
         # IRLH1
           IRLH I (VCC) O ($15)
         # IQOEFL4
           IQOEFL I ($50 VCC) O ($26 VSSTT)
         # IQOEFL3
           IQOEFL I ($60 VCC) O ($27 VSSTT)
         # IQOEFL2
           IQOEFL I ($15 VCC) O ($25 VSSTT)
         # IQOEFL1
           IQOEFL I ($14 VCC) O ($24 VSSTT)
         # IQDIFF4
           IQDIFF I ($27 $26 $50 $60) O ($9)
         # IQDIFF3
           IQDIFF I ($25 $24 $50 $60) O ($10)
         # IQDIFF2
           IQDIFF I (D VBB1 $14 $15) O ($16)
         # IQDIFF1
           IQDIFF I ($25 $24 $14 $15) O ($17)
         # IQCSH3
           IQCSH I (VCS $3) O (VSSEE)
         # IQCSH2
           IQCSH I (VCS $18) O (VSSEE)
         # IQCSH1
           IQCSH I (VCS $4) O (VSSEE)

ENDMACRO
```

KEY TO FIG. 24

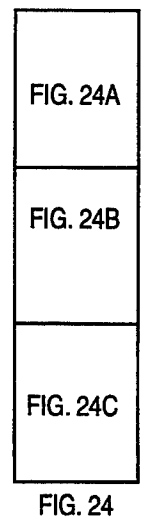

```
DEFINE ISLAVE52    I(VXIS) &
                   O(VCSI VBB2I VBB1I)

MULTITYPE

# R3
    RBASE VCC $NET3
    # R1
    RBASE VCC $NET4
    # R2
    RBASE $NET1 VSSEE
    # R4
    RBASE $NET6 $NET5
    # R5
    RBASE VCSI VSSEE
    # Q4
    QNPN $NET5 $NET5 VSSEE
    # Q7
    QNPN VBB2I VBB2I VBB3I
    # Q2
    QNPN $NET3 $NET3 $NET2
    # Q5
    QNPN VCC $NET3 VBB1I
    # Q6
    QNPN VBB1I $NET2 VBB2I
    # Q8
    QNPN VBB2I $NET1 VCSI
    $ Q3
    QNPN $NET2 $NET1 $NET6
    # Q1
    QNPN $NET4 VXIS $NET1

ENDMACRO
```

FIG. 25

```
DEFINE ISLAVE52      I(VXIS) &
                     O(VCSI VBB3I VBB2I VBB1I)

MULTITYPE

# R3
    RBASE VCC $NET3
    # R1
    RBASE VCC $NET4
    # R2
    RBASE $NET1 VSSEE
    # R4
    RBASE $NET6 $NET5
    # R5
    RBASE VCSI VSSEE
    # Q4
    QNPN $NET5 $NET5 VSSEE
    # Q7
    QNPN VBB2I VBB2I VBB3I
    # Q2
    QNPN $NET3 $NET3 $NET2
    # Q5
    QNPN VCC $NET3 V8B1I
    # Q6
    QNPN VBB1I $NET2 VBB2I
    # Q8
    QNPN VBB3I $NET1 VCSI
    # Q3
    QNPN $NET2 $NET1 $NET6
    # Q1
    QNPN $NET4 VXIS $NET1

ENDMACRO
```

```
USAGE       DEF2KTXT def_file
AUTHOR      Dar-Sun Tsien

REVISION    9/8/88 Dar-Sun
            Only change, VCCnn, and VSSnn into VCC and VSS.
            VSSEE and VCCTT remain the same.
            10/28/88 Dar-Sun 01/89 Ma. Chang
                added two power supplies VCCTTL, GNDTTL
                02/89 added nodes VCCN and VCCA
                06/89added blank at the end of nodes for ease of
                searching
*/ include <stdio.h> define BUFLEN      4096
define ERREXIT     0
#define TRUE        '\1'
#define FALSE       '\0'
#define SCOPY(a, b)    {\
        a = (char *) malloc((strlen(b) + 1) * sizeof(char));\
        strcpy(a, b);\
}
char *pargv[BUFLEN / 2];
int pargc;

typedef struct dictrec {
        char *key;
        char *n;
        struct dictrec *left, *right;
        int bal;
} *dictptr;

dictptr namdic; /* dictionary of names */ main(argc, argv)
int argc;
char *argv[];
{
        FILE *in, *txt, *kic;
        int i, n;
        char buf[BUFLEN], dum, tmp[BUFLEN];
        dictptr avl(), curnam;

if (argc != 3) {
                fprintf(stderr, "Usage: def2ktxt def_file\n");
                exit(ERREXIT);
```

```
        }
        if ((in = fopen(argv[2], "r")) == NULL) {
                fprintf(stderr, "Can't open %s.\n", argv[2]);
                exit(ERREXIT);
        } while (fparse(buf, BUFLEN, in)) {
                if (pargc == 0) continue;
                dum = FALSE;
                curnam = (dictptr) avl(pargv[0], &namdic, &dum, TRUE);
                SCOPY(curnam->n, pargv[1])
        }
        fclose(in);

if ((in = fopen(argv[1], "r")) == NULL) {
                fprintf(stderr, "Can't open %s.\n", argv[1]);
                exit(ERREXIT);
        } if ((txt = fopen("EDTEXT.TXT", "w")) == NULL) {
                fprintf(stderr, "Can't open EDTEXT.TXT.\n", argv[3]);        exit(ERREXIT);
        } while (fparse(buf, BUFLEN, in)) {
                if (pargc == 0) continue;
                if (!strcmp(pargv[0], "CREATE")) {
                        if (pargv[2][0] != '"' && pargv[2][strlen(pargv[2])-1] != '"') {
                                fprintf(stderr, "Expecting \"...\", but get %s.\n", pargv[2];
                                exit(ERREXIT);
                        }
                        pargv[2][strlen(pargv[2]) - 1] = '\0';
                        if ((kic = fopen("chip.k", "w")) == NULL) {
                                fprintf(stderr, "Can't open chip.k\n");
                                exit(ERREXIT);
                        }
                        fprintf(kic, "9 chip.k;\nOS 0 1 1;\n");
                }
                else if (!strcmp(pargv[0], "SELECT")) {}
                else if (!strcmp(pargv[0], "INSERT")) {
                        if (!strcmp(pargv[1], "TEXT")) {
                                if (pargv[2][0] != '"' && parqv[2][strlen(pargv[2])-1 != '"') {
                                        fprintf(staerr, "Expecting \"...\", but get %s.\n",
                                                pargv[2]);
                                        exit(ERREXIT);
```

```
}
pargv[2][strlen(pargv[2] - 1] = '\0';
for (n = 1; pargv[2][n] != ';' && pargv[2][n] != '\0'; n++);
if (pargv[2][n] == ';') pargv[2][n] != '\0';
if (!strcmp(&(pargv[2][1]), "VCCTT"))
        strcpy(tmp, "VCCTT:");
else if (!strcmp(&(pargv[2][1]), "VCCTTL"))
        strcpy(tmp, "VCCTTL:");
else if (!strcmp(&(pargv[2][1]), "GNDTTL"))
        strcpy(tmp, "GNDTTL:");
else if (!strcmp(&(pargv[2][1]), "VCC03"))
        strcpy(tmp, "VCC:");
else if (!strcmp (&(pargv[2][1]), "VCC02"))
        strcpy(tmp, "VCC:")
else if (!strcmp(&(pargv[2][1]), "VCC01"))
        strcpy(tmp, "VCC:");
else if (!strcmp(&(pargv[2][1]), "VCCN"))
        strcpy(tmp, "VCC:");
else if (!strcmp(&(pargv[2][1]), "VCCA"))
        strcpy(tmp, "VCC:");
else if (!strcmp(&(pargv[2][1]), VCC"))
        strcpy(tmp, "VCC:");
else if (!strcmp(&(pargv[2][1]), "VSSTT"))
        strcpy(tmp, "VSS:");
else if (!strcmp(&(pargv[2][1]), "VSSEE"))
        strcpy(tmp, "VSSEE:");
else if (!strcmp(&(pargv[2][1]), "VSS"))
        strcpy (tmp, "VSS:";)
else {
        dum = FALSE;
        curnam = (dictptr) avl(&pargv[2][1], &namdic, &dum, FALSE);
        if (!curnam) {
                fprintf(stderr,
                "Text %s is not in the xref.\n", &pargv[2][1]);
                /*exit(ERREXIT);*/
                continue;
        }
        strcpy(tmp, curnam->n);
}
fprintf(txt, "%s X=%d Y=%d", tmp,
                atoi(pargv[4]), atoi(pargv[5]));
for (i = 0; 1 < strlen(pargv[3]); i++)
        if (pargv[3][i] == '=') break;
if ((i = atoi (&(pargv [3][i+1]))) == 7)
        fprintf(txt, "ATTACH=METAL1\n");
else if (i == 9)
        tprintf(txt, " ATTACH=METAL2\n");
else
        fprintf(txt, "\n");
```

FIG. 30D

```c
        }
        else if (!strcmp(pargv[1], "CELL")) {
                if (pargv[2][0] != '"' && pargv[2][strlen(pargv[2])-1] != '"') {
                        fprintf(stderr, "Expecting \"...\", but get %s.\n",
                                pargv[2]);
                        exit(ERREXIT);
                }
                pargv[2][strlen(pargv[2]) - 1] = '\0';
                fprintf(kic, "9 %s.k;\nC 0 T %d %d;\n", &pargv[2][1],
                        atoi(pargv[3]) * 100, atoi(pargv[4]) * 100);
        }
    }
    if (!strcmp(pargv[0], "END_CELL")) {
        fprintf(kic, "DF;\n");
        break;
    }
  }
  fclose(in);
  fclose(kic);
  fclose (txt);
} fparse(buf, len, fp)
char buf[];
int len;
FILE *fp;
{
    int i, j, c, inquote;
    i = j = inquote = 0;
    if ((c = getc(fp)) == EOF) return(0);
    buf[i] = toupper(c);
    if (c == '"') inquote = 1;
top:
    while (buf[i] == ' ' || buf[1] == ',' || buf[i] == '\t' ||
            buf[i] == '(' || buf[i] == ')' || buf[i] == ':') {
        buf[i] = '\0';
        if (++i < len) {
                c = getc(fp);
                if (c == '"') inquote = inquote ? 0 : 1;
                buf[i] = toupper(c);
        }
        else {
                fprintf(stderr, "BUF too small!\n");
                exit(ERREXIT);
        }
    }
    if (buf[i] == '\n' || (inquote == 0 && buf[i] == ';')) goto end;
    pargv[j++] = & (buf[i]);
```

```
            while (buf[i] != ' ' && buf[i] != '\t' && buf [i] != ',' &&
                    buf[i] != '\n' && (inquote || buf[i] != ';') &&
                    buf[i] != ':' && but[i] != '(' && buf[i] != ')') {
                if (++i < len) {
                    c = getc(fp);
                    if (c == '"') inquote = inquote ? 0 : 1;
                    buf[1] = toupper(c);
                }
                else {
                    fprintf(stderr, "BU= too small!\n");
                    exit(ERREXIT);
                }
            }
            goto top;
        end:
            buf[i] = '\0';
            pargc = j;
            return(1);
} dictptr avl(a, p, c, b)
char a[];
dictptr *p;
char *c;
char b; /* TRUE if insert is required */
{
        dictptr p1, p2, rcav1;

if ((*p) == NULL) {
                if (b) {
                        (*p) = (dictptr) calloc(1, sizeof(struct dictrec));
                        (*p)->key = (char *) malloc(sizeof(char) * strlen(a) + 1);
                        rcavl = (*p);
                        (*c) = TRUE;
                        strcpy((*p)->key, a);
                        (*p)->left = (*p)->right = NULL;
                        (*p)->bal = 0;
                        (*p)->n = NULL;
                }
                else rcavl = 0;
        }
        else if (strcmp(a, (*p)->key) < 0) {
                rcav1 = avl(a, &((*p)->left), c, b);
                if (*c) { /* left branch has grown higher */
                switch ((*p)->bal) {
                case 1:
                        (*p)->bal = 0;
                        (*c) = FALSE;
                        break;
                case 0:
                        (*p)->bal = -1;
                        break;
```

```
case -1: /* rebalance required */
        p1 = (*p)->left;
        if (p1->bal < 0) { /* single LL rotation */
                (*p)->left = p1->right;
                p1->right = (*p);
                (*p)->bal = 0;
                (*p) = p1;
        }
        else {
                p2 = p1->right;
                p1->right = p2->left;
                p2->left = p1;
                (*p)->left = p2->right;
                p2->right = (*p);
                if (p2->bal < 0) (*p)->bal = 1;
                else (*p)->bal = 0;
                if (p2->bal > 0) p1->bal = (int) (-1 );
                else p1->bal = 0;
                (*p) = p2;
        }
        (*p)->bal = 0;
        (*c) = FALSE;
        }
    }
}
else if (strcmp(a, (*p)->key) > 0) {
    rcavl = avl(a, &((*p)->right), c, b);
    if (*c) {
        switch ((*p)->bal) {
            case -1:
                (*p)->bal = 0;
                (*c) = ALSE;
                break
            case 0:
                (*p)->bal = 1;
                break;
            case 1:
                p1 = (*p)->right;
                if (p1->bal > 0) {
                        (*p)->right = p1->left;
                        p1->left = (*p);
                        (*p)->bal = 0;
                        (*p) = p1;
                }
                else {
                        p2 = P1->left;
                        p1->1eft = p2->right;
                        p2->right = p1;
                        (*p)->right = p2->left;
                        p2->left = (*p);
                        if (p2->bal > 0) (*p)->bal = (int) (-1);
                        else (*p)->bal = 0;
                        if (p2->bal < 0) p1->bal = 1;
```

```
                            else p1->bal = 0;
                            (*p) = p2;
                        }
                    (*p) ->bal = 0;
                    (*c) = FALSE;
                }
            }
        }
        else {
            rcav1 = (*p);
            (*c) = FALSE;
        }
        return (rcavl);
    }
```

KEY TO FIG. 30

CIRCUIT LEVEL NETLIST GENERATION

This application is a continuation of application Ser. No. 07/493,057, filed Mar. 13, 1990, now abandoned.

FACSIMILE REPRODUCTION AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

REFERENCE TO MICROFICHE APPENDIX

A computer program listing consisting of a total of 6 microfiche and a total of 483 frames and referenced herein as "the Appendix" was submitted to the Patent and Trademark Office as a microfiche appendix to this patent document, and hereby is incorporated herein by reference. The microfiche appendix contains 21 Parts, as follows:

| | |
|---|---|
| 1: AUTOIO.C;52 | 2: DEFGEN.C;6 |
| 3: FIXGENNET.C;6 | 4: GENBIO.C;4 |
| 5: GENMDL4K.C;13 | 6: GENMDL14K.C;1 |
| 7: GET_TOKEN.C;63 | 8: MASKNAME.C;15 |
| 9: MDL2CDL.C;2 | 10: MERGEMDL_4K.C;3 |
| 11: MERGEMDL_13K.C;2 | 12: MERGEMDL_14K.C;3 |
| 13: MERGEMDL_14KRAM.C;1 | 14: NEWGENNET_4K.C;6 |
| 15: NEWGENNET_13K.C;5 | 16: NEWGENNET_14K.C;4 |
| 17: NEWGENNET_14KRAM.C;3 | 18: READS50.C;52 |
| 19: SKELSM.C;3 | 20: SKELGEN.C;6 |
| 21: PSON.PAS;21 | |

BACKGROUND OF THE INVENTION

1. Field of the Invention

The present invention relates to computer aided design of electronic circuits, and more particularly to the generation of a circuit level netlist from a logic level netlist of an integrated circuit.

2. Description of Related Art

The high cost of integrated circuit design has led to the development of circuits that are customized to perform a user-defined function. This class of circuits includes the gate array, which is an integrated circuit that includes an array of unwired logic gates that are customized at the metallization mask stage.

The design and layout sequence 30 for a customer designed gate array, which generally is known as a customer "option," is illustrated in FIG. 1. FIG. 1 also shows a connectivity check step 28 which follows the design and layout sequence 30. Integrated systems for performing the design and layout sequence of FIG. 1 are generally available, and include the FAIRCAD (Trademark) system of National Semiconductor Corporation, Santa Clara, Calif.

The design and layout sequence 30 generally begins with a schematic capture step 10 and the generation of logic netlist 12. The logic netlist 12 is a logic level description of the customer option, specifying the names of each individual occurrence or "instance" of macrocells in the customer option, pin utilization, and connectivity between the various macrocell instances. In the FAIRCAD system, the filename of the logic netlist 12 is GENNET.LIS. In performing the schematic capture step 10, the option designer works with a predetermined set of logical element symbols, interconnecting each instance of a logic element in the customer option as desired and specifying parameters for each instance. These parameters include power requirements and number of inputs and outputs desired. Schematic capture software suitable for operation on workstations or general purpose computers is separately available from such vendors as, for example, Silvar-Lisco, Inc. of Sunnyvale, Calif.

A pre-layout simulation 14 preferably is performed on the logic netlist 12 to confirm the logic functionality of the customer option. If the logic functionality is not satisfactory, the customer option is modified as necessary by repeating the schematic capture step 10. Another pre-layout simulation is performed on the modified logic netlist 12 to confirm the logic functionality of the redesigned customer option. Suitable simulation software systems for use on workstations or general purpose computers include the FAIRLOGS (Trademark) system, which is part of the FAIRCAD system available from National Semiconductor Corporation; and the VERILOGS (Trademark) system, available from Gateway Design Automation Corp., Westford, Mass.

Once the logic functionality of the customer option is confirmed, a placement and routing operation 16 is performed on the customer option, as represented in the logic netlist 12. Several files result from the placement and routing step 16, the most notable of which are a physical connectivity data file 17, a file 18 that provides the bias driver identification associated with every macro instance in the customer option, a file 19 that specifies the names of input I/O macro instances of the customer option using pulldown resistors, and a file 20 specifying the pad to signal name relationships for the customer option. In the FAIRCAD system, these files are known as DESIGN.DFF, DESIGN.BOV, DESIGN.MVA, AND XXAUTOPIN.S50 respectively. The physical connectivity data file 17, the bias driver identification file 18, and the I/O macro pulldown resistor definition file 19 are used in a post-processing step 22, discussed below. The pad - I/O signal relationship file 20 is generally used in a test verification operation that occurs after fabrication of the customer option. Placement and routing software systems for use on workstations or general purpose computers are available separately, and include the GARDS system available from Silvar-Lisco, Inc.

A post-layout simulation preferably is then done to confirm the timing characteristics of the physical connectivity, which is modified as necessary in an iterative process involving placement and routing step 16 and post-layout simulation step 21. The previously mentioned FAIRLOGS system and VERILOGS system are suitable for use in post-layout simulation.

Once the physical connectivity of the file 17 is confirmed, the physical connections are "databased" from the physical connectivity data file 17 in a post-processing operation 22 to produce a physical data base 24. The physical data base 24 preferably is produced in a suitable industry standard format, such as the CV format of the Computervision Corporation of Bedford, Mass. which is now a division of Prime Computer, Inc.; the APL format of the CAD/CAM Division of Schlumberger Technologies, Inc., Ann Arbor, Mich.; and the GDS format of the Calma Company of San Diego, Calif., now a division of Prime Computer, Inc.

The post-processing operation 22 requires many input files. Some of these input files are physical data base files contained in several different libraries. One set of input files is found in the macrocell library 2. The files of this set are for the various types of macrocells corresponding to the logic elements made available to the option designer. A macrocell is an elementary circuit used as a building block in the design of ASIC chips such as gate arrays and standard cells, and may have various power and input/output configurations. Macrocell libraries are available from a number of manufacturers, including National Semiconductor Corporation, which describes an ECL family of macrocells in a publication entitled FGA Series Macro Library for AS-PECT (Trademark) ECL Gate Arrays, Revision No. 0.3, 1989. Another set of input files is found in the overlay library 4. The files of this set are for various metallization and contact layer definitions used in customizing an instance of a macrocell to a selected power configuration. Another set of input files is found in the bias generator library 6. The files of this set are for various standard bias generators.

Some of the input files to the post processing step 22 are generated in the placement and routing step 16, as described above. One of these files is the physical connectivity file 17 (DESIGN.DFF). Another input file, the bias driver identification file 18 (DESIGN.BOV), contains an identification of the bias netlist utilized by each single macro instance. Another input file, the I/O macro pulldown file 19 (DESIGN.MVA), defines the pulldown resistor utilization of the various input macros.

To ensure correct implementation of the customer option, a physical connectivity check must be done on the layout. Traditionally, physical connectivity checking was performed manually in a process called "plot checking." The physical data base files are used to print composite plots 26, which are reviewed by an integrated circuit engineer in a connectivity checking operation 28. Unfortunately, a plot check of, for example, an ECL (emitter-coupled logic) gate array design of 15,000 gate level complexity at a component level is time and resource intensive and subject to human error. The plot check is further complicated by the option designer's use of different configurations of each macrocell, due to different requirements for power and input/output combinations throughout the customer option.

The macrocell library 2, the overlay library 4, and the bias generator library 6 generally are created as follows. A circuit level netlist is prepared, either by being written directly by an engineer or generated automatically from a circuit schematic prepared by an engineer. The macrocell is laid out using computer tools, such as, for example, the SCALD (Trademark) system with the LED and LED2STREAM software, which is available from Valid Logic Systems, Inc. of San Jose, Calif. The resulting physical data base is compared with the circuit level netlist, also commonly with computer tools, to ensure consistency in continuity. Commercially available software suitable for performing the comparison includes the "Layout versus Schematic" system available from Cadence Design Systems, Inc. of Santa Clara, Calif.; and the "Network Consistency Check" system available from Silvar-Lisco, Inc.

Unfortunately, this technique is not effective for use on large circuit designs. The manual generation of a circuit schematic or a circuit level netlist for an entire customer option, which generally includes many macrocell instances in complex arrangements, is time and resource intensive and subject to human error. For an ECL (emitter-coupled logic) gate array design of 15,000 gate level complexity, for example, the manual generation of a circuit schematic netlist may be commercially impracticable.

SUMMARY OF THE INVENTION

The present invention simplifies such activities as connectivity checking by providing an easily implemented technique for generating a circuit schematic level netlist from a logic level netlist. When implemented on a computer, the invention achieves a rapid and automatic generation of the circuit schematic level netlist.

These and other advantages are achieved by the present invention, which in one embodiment is a method for generating a circuit level netlist from a customer logic design of an application specific integrated circuit. In this method, a first set of files is acquired that corresponds to reoccurring combinations of components present in a set of macrocells, the macrocells of which correspond to the logic elements available for use by the designer of the customer option. A second set of files is acquired that corresponds to the macrocells of the macrocell set. The component combinations are represented in this second set in high level symbology. A logic netlist that identifies macrocell instances in said design and defines the connectivity therebetween is acquired. Then, a circuit level netlist of the customer option is constructed from the logic netlist and the first and second sets of files. This circuit level netlist may be compared with the physical data base of the customer option to check connectivity.

In a further embodiment, the second set of files corresponding to the macrocells of the macrocell set is acquired by the following steps. Programmable input and output circuits used in the macrocells of the macrocell set are identified, and the occurrences of the identified input and output circuits are omitted. A third set of files corresponding to the identified input and output circuits is acquired. Then, the circuit level netlist of the customer option is constructed from the logic netlist and the first, second and third sets of files.

BRIEF DESCRIPTION OF THE DRAWINGS

In the drawings, where like reference numerals indicate like parts,

FIG. 3 is a logic symbol for a 5-input, 2-output OR gate;

FIG. 4 is a circuit schematic of the OR gate of FIG. 3;

FIG. 5 is a partitioned circuit level netlist of the OR gate of FIG. 4;

FIG. 6 is a partitioned circuit level netlist of a variation of the OR gate of FIG. 4;

FIGS. 7A–7K are sets of base skeleton files and I/O skeleton files derived from two power levels of the OR gate of FIG. 3;

FIGS. 8A–8F sets of subcircuit files used in the MDL netlists of FIGS. 5 and 6;

FIGS. 10-26 include examples of base skeleton files and I/O skeleton files, as well as of the MDL netlists from which they were derived;

DETAILED DESCRIPTION OF THE PREFERRED EMBODIMENT

Figure 1:
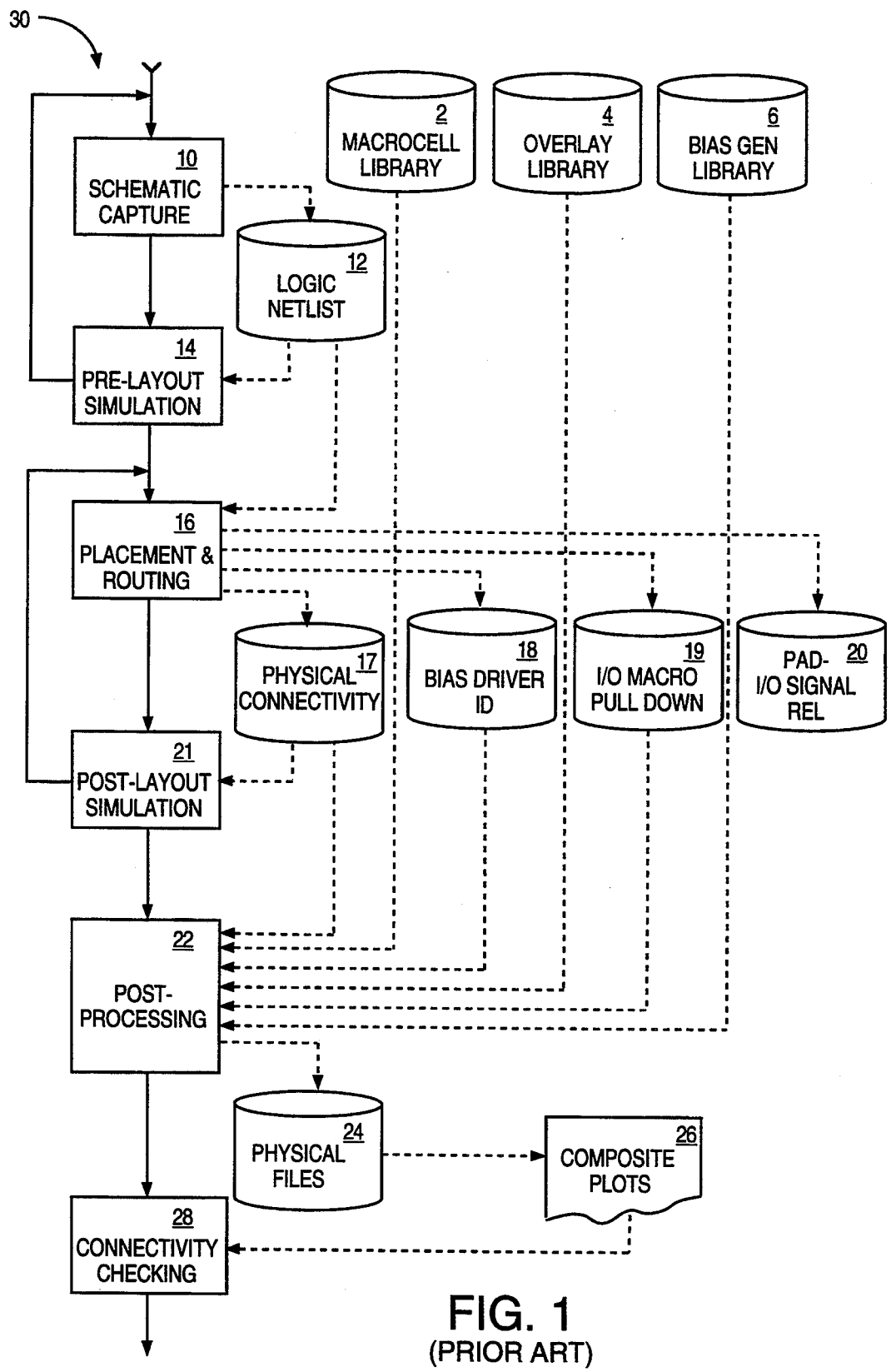
FIG. 1 is a flow diagram showing process flow and data flow for a prior art integrated circuit design, layout and connectivity checking sequence.
Figure 2:
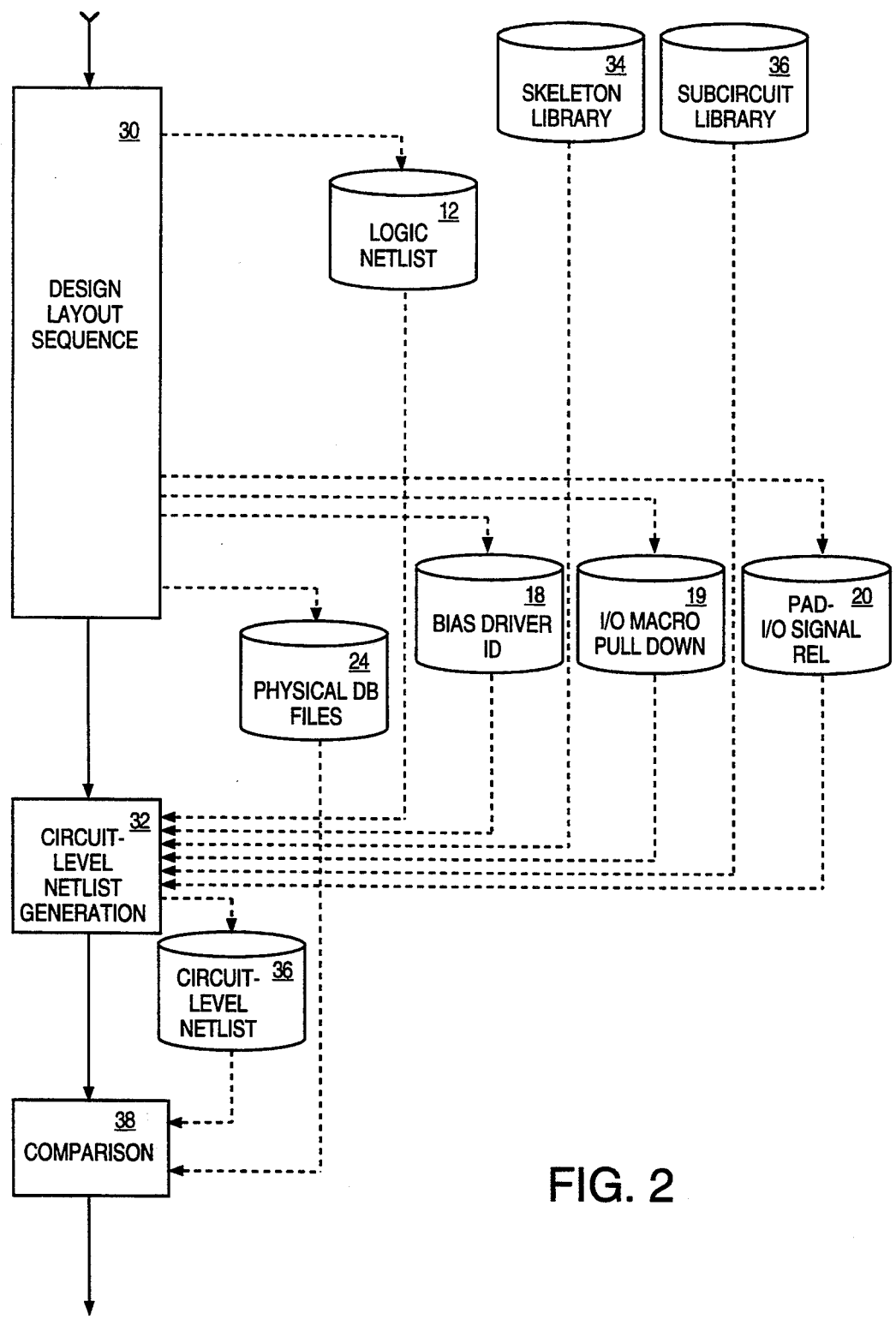
FIG. 2 is a flow diagram showing process flow and data flow for a connectivity checking sequence in accordance with the present invention.

As shown in FIG. 2, a netlist generation step 32 results in a circuit level netlist file 36 for the entire customer option. A number of conventionally generated files are used in producing the circuit level netlist 36, including the logic netlist 12, the bias driver identification file 18, the I/O macro pulldown resistor definition file 19, and the pad - I/O signal relationship file 20. Two unique file libraries also are used in generating the circuit level netlist 36, viz. a skeleton file library 34 and a subcircuit library 36. The contents and derivation of the skeleton file library 34 and the subcircuit library 36 are discussed below. A physical connectivity check is performed automatically in step 38, in which the circuit level netlist 36 is compared with the physical data base 24. The results of the comparison step 38 is a verification of the physical connectivity of the physical data base 24 for the customer option.

Derivation of Skeleton Netlist Files

The skeleton file library 34 includes base skeleton files and input/output ("I/O") skeleton files. The base skeleton files correspond to the various types of macrocells that can be obtained from the macrocell library 2 and the overlay library 4. A macrocell "type" is considered to be a macrocell defined by logic function and power. Each base skeleton file contains only those netlist elements that are "fundamental" to the macrocell; the concept of "fundamental" is explained below. The netlist elements of the base skeleton files are components, including standard components and high level components. The I/O skeleton files correspond to the various types of input and output circuits that are "programmable" by the designer, meaning that the designer determines whether such I/O circuits are included in a macrocell instance. The netlist elements of the I/O skeleton files are components, including standard and high level components.

To derive the skeleton file library 34, the circuit schematics of the macrocells in the macrocell library of interest are studied with the objective of defining the macrocells as combinations of standard components and high level components. Standard components include individual resistors and transistors. High level components are subcircuits common to at least some of the macrocell types. The objective in defining high level components is to achieve a balance between minimizing the number of components in each base skeleton file, while maximizing the instances of high level components across the skeleton file library 34. Within these criteria, discretion exists in defining the high level components.

The subcircuits corresponding to the high level components are collected into a set. This set becomes the subcircuit library 36.

Once the high level components are identified, a circuit level netlist file defining each type of macrocell is created in a suitable language such as the MDL ("Master Data Language") language. This circuit level netlist file includes standard component symbology and, as appropriate, high level component symbology. The netlists defining the various types of macrocells are created in a "partitioned" form. Partitioned form means that each netlist is expressed in as many high level components as possible, with standard components being used only when no high level components are suitable for replacing them. This part of the netlist is known as the "redefined" macro. Definitions for the high level components are included in the netlist, following the redefined macro.

The redefined macros then are distilled to respective base skeleton files for each type of macrocell. Each base skeleton file contains only those components that will be consistently present in every instance of the macrocell type in the customer options, regardless of the number of programmable inputs and outputs and regardless of the manner of interconnection. Accordingly, the distillation of an redefined macro to form a base skeleton file involves deleting the programmable I/O circuit definitions.

The programmable I/O circuit definitions are not lost, however. Purged of redundant definitions, they collectively form a set of I/O skeleton files which are included in the skeleton library 34.

To better understand the process for forming the skeleton library 34, consider as an example a 5-input, 2-output OR gate shown in logic symbology in FIG. 3. The circuit schematic diagram for a low power version 39 of the OR gate is shown in FIG. 4. An OR gate can be defined as having a current switch with programmable inputs and outputs, existing in various power configurations. Specifically, the low power OR gate 39 includes a low power current switch 46, five inputs 41-45, and a low power output stage 48 with two outputs. Two high level components are present in the low power current switch 46: a load resistor 50 and a current source 52. It will be appreciated that load resistors and current sources are frequently present in ECL circuits (although generally not connected together), and that by defining these as high level components, the complexity of the netlists representing the ECL circuits in which they are found is considerably reduced. Two nodes are identified, node 54 and node 56. The switching transistor 40 is a standard component. The inputs to the current switch 46 are five standard components, viz. the NPN transistors 41-45. Two high level components are present in the output stage: emitter followers with respective outputs Z and ZL.

Having identified the high level components, one now generates a partitioned netlist file in a suitable language such as the MDL language. A partitioned MDL circuit level netlist file OR05DL.MDL for OR gate 39 is shown in FIG. 5. The MDL commands are created either by directly writing the MDL code, or by converting the circuit schematic of FIG. 4 with a suitable software system such as the MDL generator available from Silvar-Lisco, Inc. If the conversion is performed automatically, the high level components initially are defined to the software system, which then partitions the netlist accordingly.

Various structures of the MDL netlist of FIG. 5 are identifiable. The redefined macro includes fundamental components 40, 50, and 52 and nodes 54 and 56, which correspond to #RQNPN_1 (switching transistor, NPN type), #IRLH_1 (low power load resistor), #IQCSH_1 (low power current source), $NET1 (net) and $NET2 (net) respectively in the OR05DL macro MDL file of FIG. 5. The programmable inputs to the current switch 46 are the five standard components 41–45, which receive inputs A1–A5 respectively and correspond to NPN transistors #QNPN_2, #QNPN_5, #QNPN_4, #QNPN_3, and #QNPN_1 respectively in the OR05DL macro MDL file of FIG. 5. It should be noted that inputs not used merely are excluded from the circuit schematic netlist file, which physically corresponds to maintaining certain switching transistors unconnected in the physical data base 24. The programmable outputs of the current switch 46 are the two high level components 60 and 62, which correspond to output emitter followers #IQOEFL_1 and #IQOEFL_2 respectively in the OR05DL macro MDL file of FIG. 5.

Subcircuits are identifiable. The high level load resistor 50 is defined by subcircuit 51. The high level current source 52 is defined by subcircuit 53. Note that the power of the current switch 46 is controlled by the values of the load resistor 50 and the current source 52. The high level components 60 and 62 are defined by subcircuit 61. Pulldown resistors 64 and 66 are represented by "RBASE E1 $NET1," where E1 is the emitter of transistor 68 and $NET1 is the net defined for the resistor-to-resistor node in the emitter follower IQOEFH of FIG. 6. Pulldown resistors 65 and 67 are represented by "RBASE $NET1 E." Note that the power of the emitter followers 60 and 62 is determined by the value of the pulldown resistors 64–67 and the number of output transistors 68 and 69.

To better understand how various power options influence the derivation of the skeleton library 34 and subcircuit library 36, consider the partitioned MDL netlist OR05DH.MDL of FIG. 6 for a high power version of the 5-input, 2-output power OR gate of FIG. 3. The circuit from which FIG. 6 is derived includes a high power current switch, five inputs, and a high power output stage having two emitter followers with respective outputs.

Various structures of the MDL netlist of FIG. 6 are identifiable. The redefined macro includes fundamental components 70, 76, and 82 and two circuit nodes, which correspond to RQNPN_1 (switching transistor, NPN type), IRLHH_1 (high power load resistor), IQCSH-H_1 (high power current source), $NET1 (net) and $NET2 (net). The programmable inputs to the current switch are the five standard components 71–75, which receive inputs A1–A5 respectively and correspond to NPN transistors #QNPN_2, #QNPN_5, #QNPN_4, #QNPN_3, and #QNPN_1 respectively in the OR05DL macro MDL file of FIG. 6. It should be noted that inputs not used merely are excluded from the circuit schematic netlist file, which physically corresponds to maintaining certain switching transistors unconnected in the physical database 24. The programmable outputs of the current switch are the two high level components 78 and 80, which correspond to output emitter followers IQOEFH_1 and IQOEFH_2 respectively in the OR05DH macro MDL file of FIG. 6.

Subcircuits are identifiable. The high level high power load resistor 76 is defined by subcircuit 77, which is two resistors in parallel. The high level high power current source 82 is defined by subcircuit 83, which are two parallel resistors and two parallel transistors. Note that the power of the current switch is controlled by the values of the load resistor 76 and the current source 82. The high level high power emitter followers 78 and 80 are defined by subcircuit 79. A pulldown resistor is represented by "RBASE E1 E" and an output transistor is represented by "QNPN C B E1." Note that the power of the emitter followers 78 and 80 is determined by the value of the pulldown resistors and the number of output transistors.

Where high and low MDL netlists exist for a given logic type, care must be taken to name all interconnect nets associated with the I/O pins consistently. The reason for this is to ensure that all power level current switches correctly interface with all power level output emitter followers. Generally, four power combinations of base power and output power are available: high base power with high output power, high base power with low output power, low base power with high output power, and low base power with low output power. To avoid net naming errors, the net names must be identical between the high and low power skeleton files. For example, in the MDL netlists for macros OR05DL and OR05DH of FIGS. 5 and 6, $NET2 consistently represents the interface point between the current switch and the at least one output emitter follower present in the low and high power OR gates.

The base circuit skeleton files obtained from the low and high power versions of the OR gate of FIG. 3 are shown in FIG. 7, and the subcircuit files corresponding to the low and high power versions of the OR gate of FIG. 3 are shown in FIG. 8. These files can be prepared manually or automatically. A computer program for preparing these files automatically on a workstation or general purpose computer is listed in Parts 19 and 20 of the Appendix, and illustrated in FIG. 9.

Initially, the desired high power MDL and low power MDL macrocell netlists are collected. All of the collected netlists must have zero NCC errors, with false errors having been eliminated by the inclusion of components in the MDL netlist that reflect a one-to-one correspondence to all components in the layout of the macros.

Figure 9:
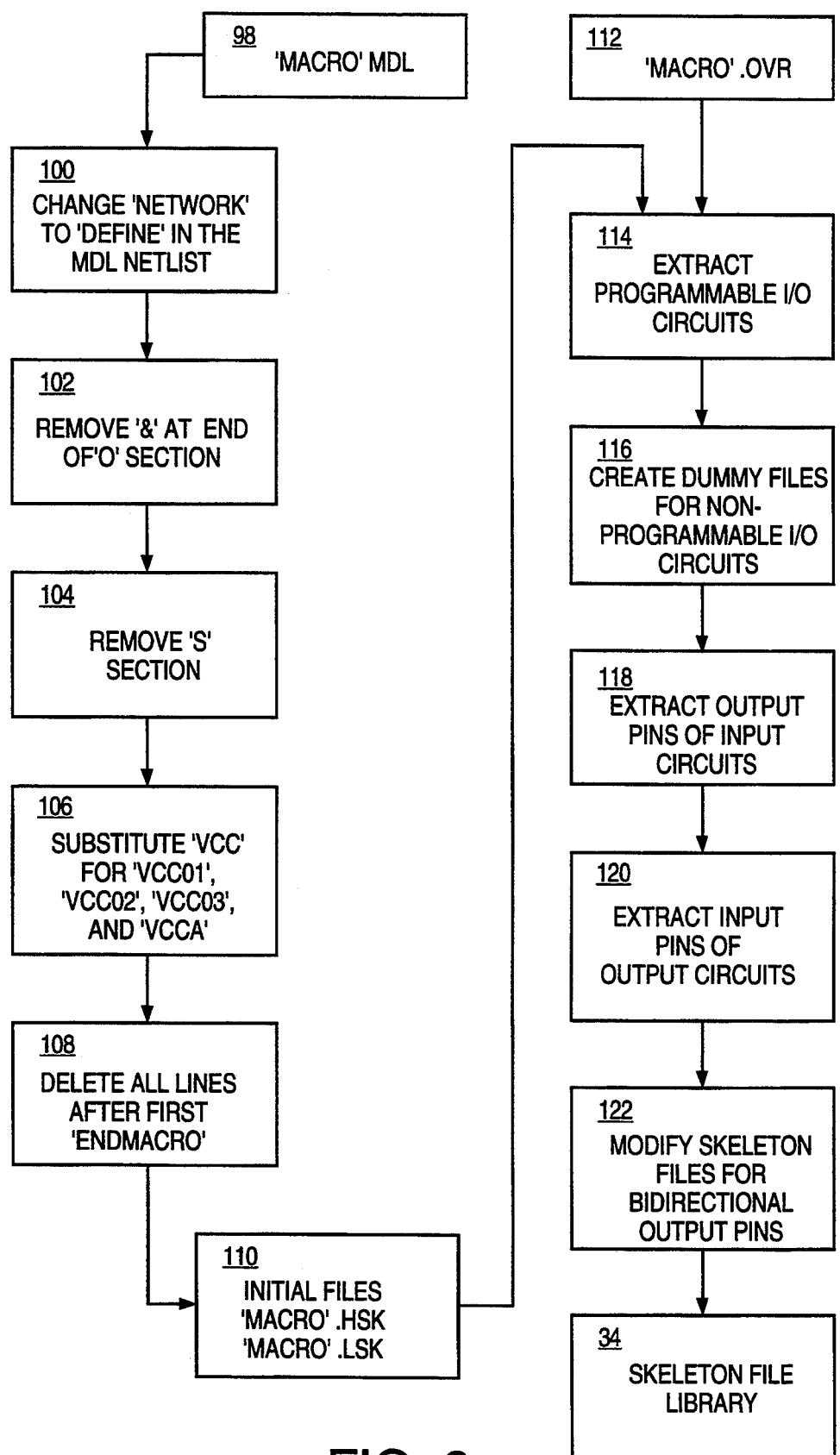
FIG. 9 is a flow chart of a computer program for generating a skeleton file library.

The collected netlists are processed by program SKELSM.C;3, which is listed in Part 19 of the Appendix. Program SKELSM.C;3 performs five operations on the collected MDL netlists, as illustrated in FIG. 9. In step 100, the variable 'NETWORK' is changed to 'DEFINE' in the MDL netlists. In step 102, the '&' character at the end of the output statement 'O' is deleted from the MDL netlists. In step 104, the power supply statement 'S' is deleted from the MDL netlists. In step 106, variable 'VCC' is substituted for the variables 'VCC01,' 'VCC02,' 'VCC03,' 'AND 'VCCA' in the MDL netlists. In step 108, the redefined macro is isolated by deleting all lines of each MDL netlist after the first 'ENDMACRO' statement encountered in the file. Initial low power and high power skeleton files 110 result.

It will be appreciated that the lines deleted from the MDL netlists contain subcircuit information. The subcircuit information exists separately without redundancy in the subcircuit library 36. The subcircuits used in the low power and high power configurations of the OR gate of FIG. 3 are IRLH, IRLHH, IQCSH, IQCSHH, IQOEFL, and IQOEFH, which are shown in FIG. 8.

Next, program SKELGEN.C;6, which is listed in Part 20 of the Appendix, is used to produce the skeleton library 34. The input files to program SKELGEN.C;6 are the initial skeleton files 110 and file 'MACRO'.OVR (112), which contains a list of the programmable input and output pin names. File 'MACRO'.OVR is generated by the program PSON.PAS;21 from the ASCII file produced by the SCALD system of Valid Logic Systems, Inc. after execution of the LED program. The program listing for PSON.PAS;21 is given in Part 21 of the Appendix. The program SKELGEN.C;6 executes steps 114, 116, 118, and 120 leading to the generation of the skeleton file library 34. Under some circumstances, an additional step 122 is performed manually, although it could be automated if desired.

In step 114, the programmable inputs and outputs are extracted from each redefined macro based on the pin names contained in file 'MACRO.'OVR. The netlists remaining after extraction are the base skeleton files. For example, the base skeleton files for the low and high power configurations of the OR gate of FIG. 3 are OR05DL.LSK and OR05DL.HSK, which are shown in FIGS. 7A and 7B respectively. The base skeleton netlist file for OR05DL includes the MDL expression of switching transistor 40 (#RQNPN_1), low power load resistor 50 (#IRLH_1), and low power current source 52 (IQCSH_1). The base skeleton netlist file for OR05DH includes the MDL expression of switching transistor 70 (#RQNPN_1), high power load resistor 76 (#IRLHH_1), and high power current source 82 (IQCSHH_1).

The I/O skeleton files for the low and high power configurations of the OR gate of FIG. 3 are obtained from the extracted I/O files. These are shown in FIGS. 7C-7K, and are respectively OR05D.LA5 and OR05D.HA5 (transistors 45 and 75), OR05D.LA1 and OR05D.HA1 (transistors 41 and 71), OR05D.LA4 and OR05D.HA4 (transistors 44 and 74), OR05D.LA3 and OR05D.HA3 (transistors 43 and 73), OR05D.LA2 and OR05D.HA2 (transistors 42 and 72), OR05D.LZ (output emitter follower 60), OR05D.LZL (output emitter follower 62), OR05D.HZ (output emitter follower 80), and OR05D.HZL (output emitter follower 78).

A certain file naming convention is used for the skeleton files. The high power base skeleton file is known as "macroname.HSK," and the low power base skeleton file is known as "macroname.LSK." For naming the output skeleton files, the conventions "macroname.HXX" and "macroname.LXX" are used, where "XX" is the name of the programmable output. For naming the input skeleton files, the conventions "macroname.HYY" and "macroname.LYY" are used, where "YY" is the name of the programmable input.

The program required dummy (blank) files for any non-programmable inputs and outputs. These are inputs and outputs which the option designer is not permitted to specify. Dummy files for non-programmable I/O pins are assigned names in step 116, in accordance with the previously described naming convention.

Where high and low MDL netlists exist for a given logic type, care must be taken to name all interconnect nets associated with the I/O pins consistently. The reason for this is explained above. As is apparent, $NET2 is consistently used in files OR05DL.MDL and OR05DH.MDL of FIGS. 5 and 6.

Some of the redefined macros may have hardwired outputs. Not all of the hardwired outputs of a redefined macro may be used by the option designer, however. Accordingly, two sets of skeleton files are used for the hardwired outputs of an redefined macro. For the first set, the I/O skeleton files 'macroname'.HXX and the 'macroname'.LXX files are generated as discussed above. In addition, a second set of files named in accordance with the convention 'macroname'.NHXX and 'macroname'.NLXX are created. This set is identical to the first set, except that the hardwired output names are preceded by the '$' character. This set is needed because unused hardwired output names in the MDL netlist must be preceded with the '$' character.

The input I/O macros are processed in step 118 by extracting their output pins in accordance with the naming convention for extracted I/O files discussed above. Since I/O macros are hardwired, a second set of extracted files is created. The filename is preceded with the '$' symbol if a pin is not designated for use. The naming convention for these files is 'macro'.NPinname. Notice that the power is replaced by an 'N'.

The output I/O macros are processed in step 120 by extracting their input pins in accordance with the naming convention for extracted I/O files discussed above. Since I/O macros are hardwired, a second set of extracted files is created. The filename is preceded with the '$' symbol if a pin is not designated for use. The naming convention for these files is 'macro'.NPinname. Notice that the power is replaced by an 'N'.

The program SKELGEN.C;6 is not suitable for processing bidirectional output pins, so that the skeleton files for a macrocell having a bidirectional output pin is modified manually in step 122. For example, consider FZ and Z as the output pins of a transmitter. FZ is the bidirectional pin. Pin Z is connected by an internal net. Z must be moved to the input section 'I( . . . Z)' and files 'macro'.HZ and 'macro'.NZ are created.

To further illustrate the methodology explained above, the MDL netlists and the skeleton files derived therefrom for a representative sample off logic elements from the FGA series macro library for ASPECT gate arrays of National Semiconductor Corporation are shown in FIGS. 10–26. While the derivation of these skeleton files from their respective MDL netlists is generally apparent in view of the prior discussion, a few additional aspects of the methodology emerge from this representative sample.

Figures 11, 11B:
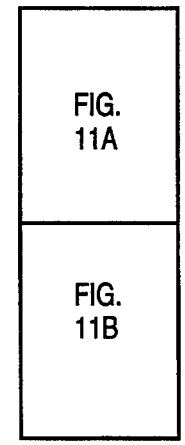

FIGS. 10, 11, and 12 show respectively a logic representation, a low power MDL netlist, and a high power MDL netlist for a 2-input AND/NAND gate type ANIO2, available from National Semiconductor Corporation. The skeleton files obtained from the MDL netlists of FIGS. 11 and 12 are shown in FIG. 13. Note, for example, the presence of dummy files ANIO2.HA;1, ANIO2.HB;1, ANIO2.LA;1 and ANIO2.LB;1, which represent non-programmable inputs A and B.

Figures 14, 15A:
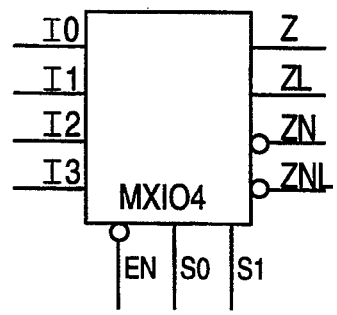
Figures 16, 16C:
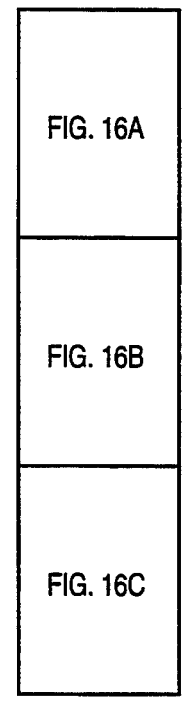

FIGS. 14, 15, and 16 show respectively a logic representation, a low power MDL netlist, and a high power MDL netlist for a 4:1 multiplexer with enable type MXI04, available from National Semiconductor Corporation. Note two new high level components in FIG. 15C: component IRLL (reference numeral 130), which is a low power load resistor configuration; and component IQDIFF, which consists of two transistors and provides four inputs (two bases and two collectors) and one output (tied emitters). The skeleton files obtained from the MDL netlists of FIGS. 15 and 16 are shown in FIG. 17. Note, for example, the presence of dummy files MXIO4.HI0, MXIO4.HI1, MXIO4.HI2, MXIO4.-HI3, MXIO4.HS0, and MXIO4.HS1.

Figures 18, 19A:
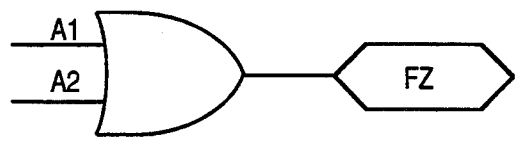
Figures 18, 19A, 19B:
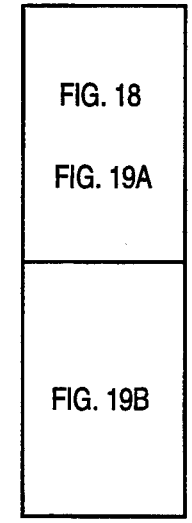

FIGS. 18 and 19 show respectively a logic representation and a high power MDL netlist for a 2-input OR gate type OR250X2, available from National Semiconductor Corporation. Note a new high level components in FIG. 19B: component 5DIO (reference numeral 134), which is a temperature compensation component consisting of two diodes and a resistor. Note that while four diodes are shown as part of component 134, in fact two of the diodes are unconnected at one of their end terminals. The skeleton files obtained from the MDL netlist of FIG. 19 is shown in FIG. 20. Note the presence of two unused inputs OR250X2.NA1 and OR250X2.NA2.

Figures 21, 22A:
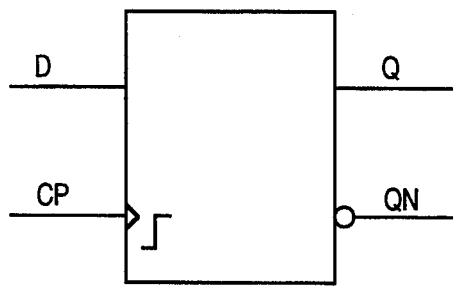
Figure 22C:
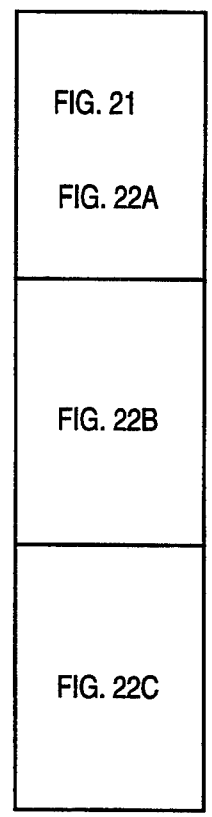
Figures 23, 23C:
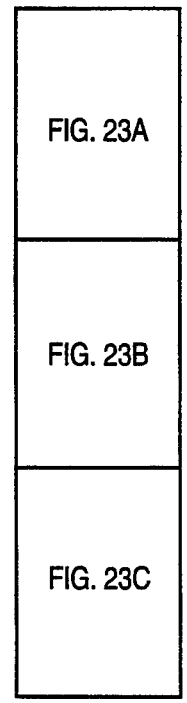

FIGS. 21, 22 and 23 show respectively a logic representation, a low power MDL netlist, and a high power MDL netlist for a D type positive edge-triggered master/slave flip-flop type DF104, available from National Semiconductor Corporation. The skeleton files obtained from the MDL netlist of FIGS. 22 and 23 is shown in FIG. 24. Note the presence of dummy input files DFI04.HCP and DFI04.HD, and dummy output files DFI04.HQ and DFI04.HQN.

FIGS. 25 and 26 are examples of skeleton files of bias drivers for, respectively, a 4K array and a 14K array. Note that the skeleton files are the MDL netlists for these circuits. This is the normal convention for bias drivers.

Circuit Level Netlist Generation

In the netlist generation step 32, several files generated in the design and layout sequence 30, viz. the logic netlist file 12, the bias driver identification file 18, the I/O macro pulldown resistor file 19, and the pad-I/O signal relationship file 20, are used in conjunction with the skeleton library 34 and the subcircuit library 36 to create a circuit level netlist 36 for the entire customer option. Circuit level netlist 36 represents the exact utilization of every macrocell in the customer option.

Figure 27A:
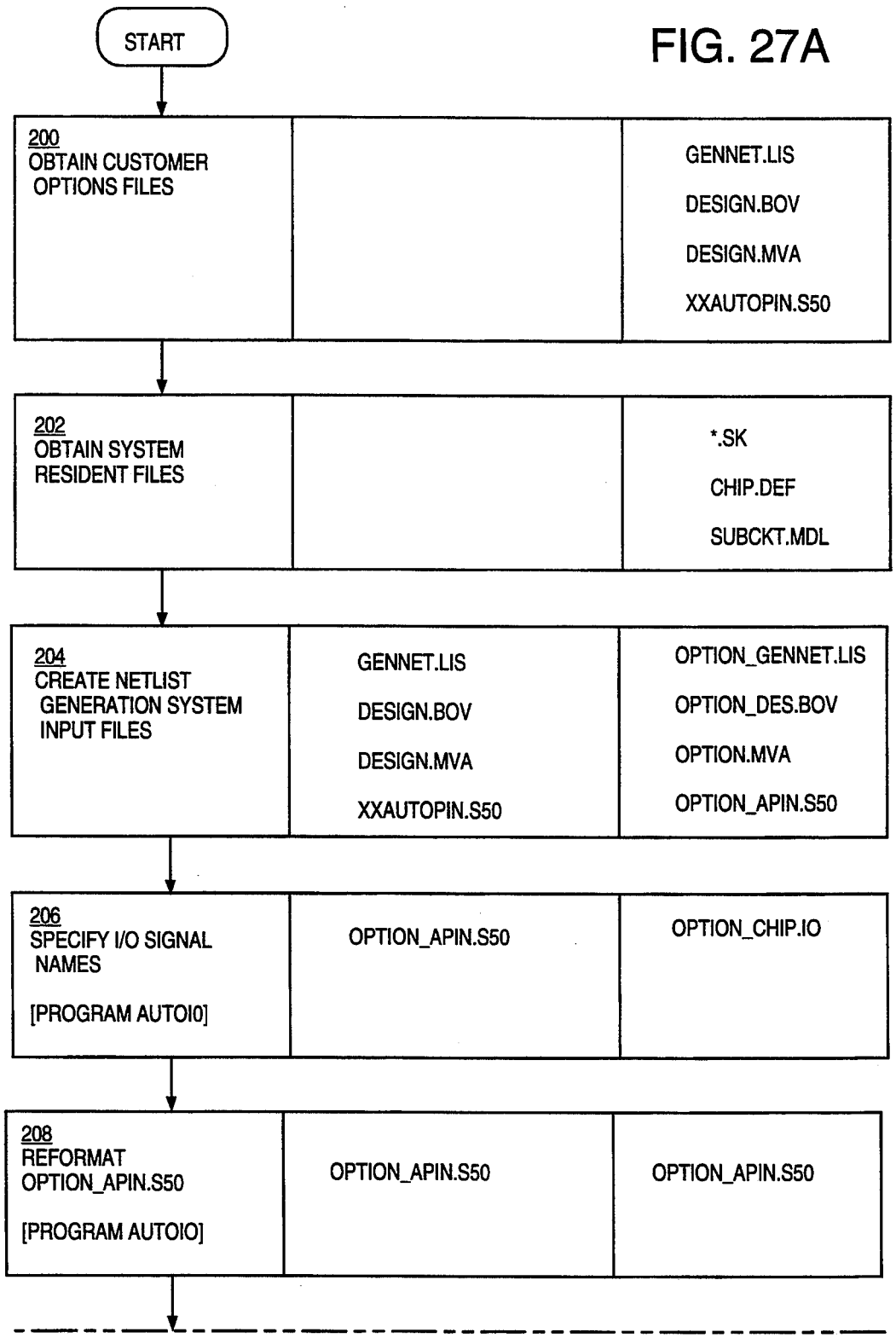
FIGS. 27A-27C are flow diagrams of a computer program for generating a circuit level netlist from a skeleton file library and a subcircuit library.
Figure 27B:
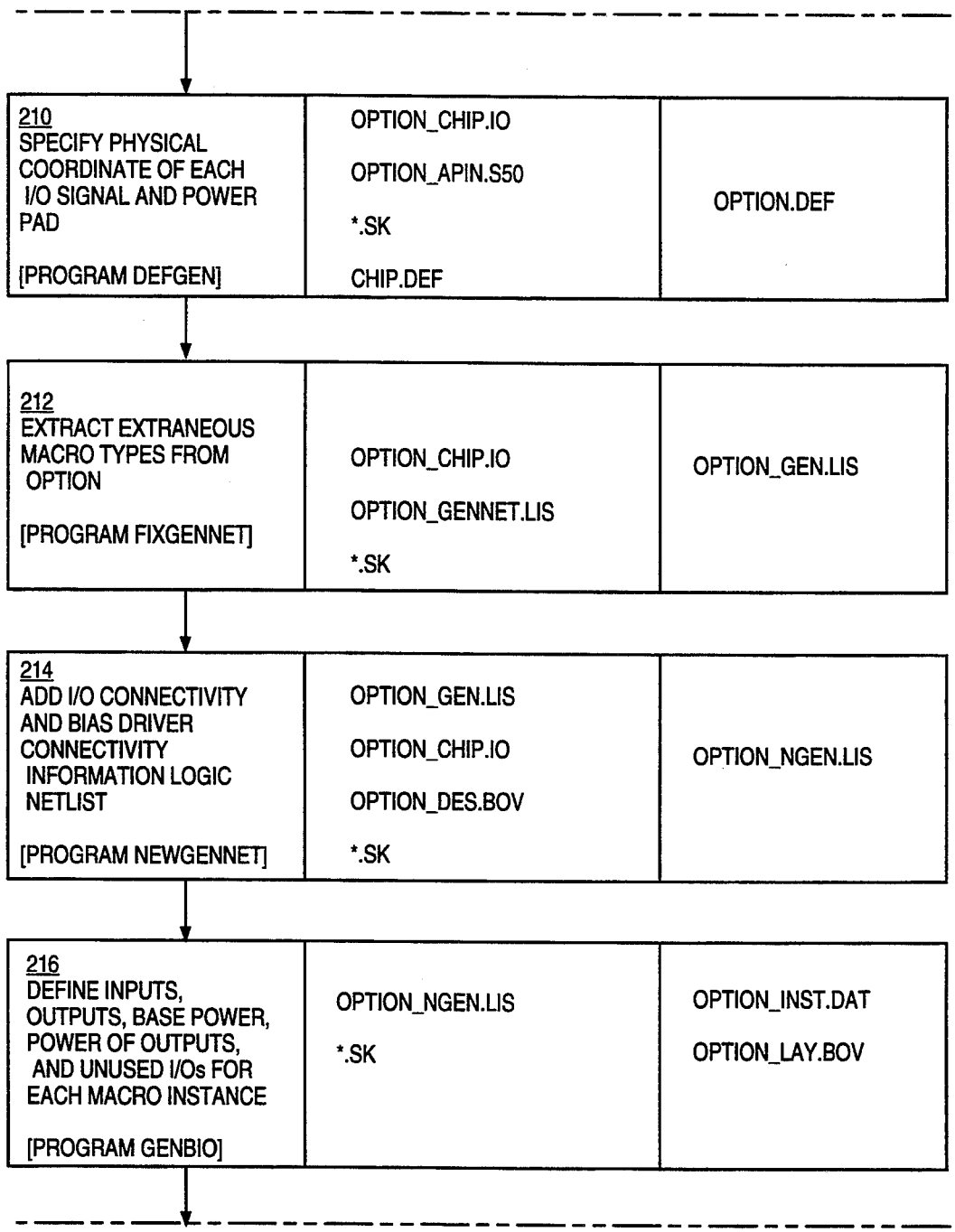
Figure 27C:
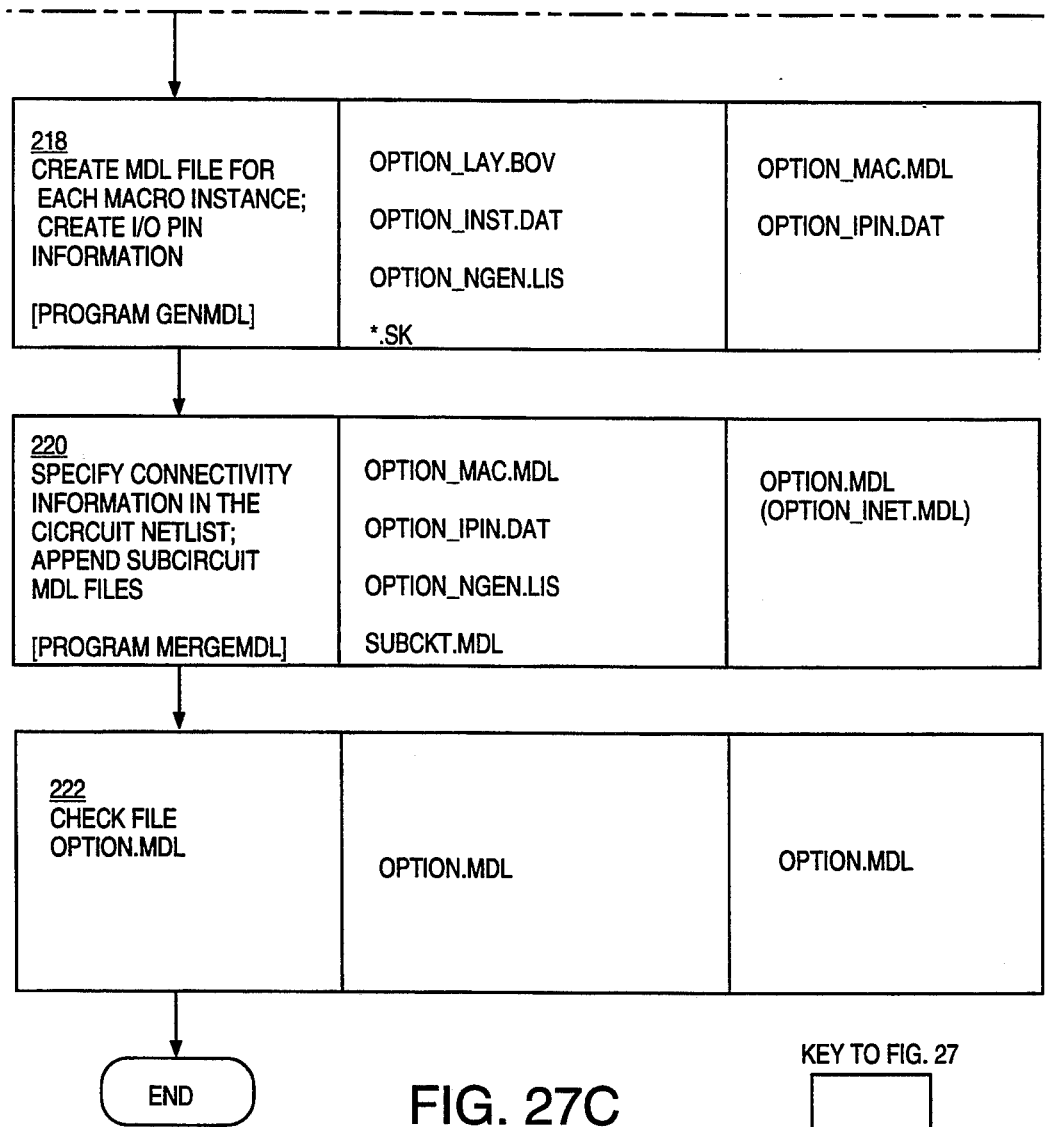
Figure 27:
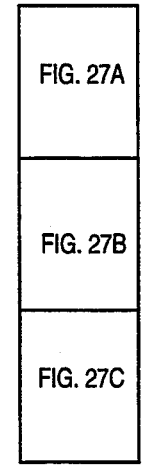

One approach to implementing the circuit level netlist generator step 32 is on a workstation or general purpose computer using suitable software. The flow diagram of FIG. 27 illustrates the operation and general content of one such suitable software system, which is listed in Parts 1–8 and 10–18 of the Appendix. This program, or netlist generation system, is suitable for ASPECT FGA1.3K, FGA 4K, and FGA 14K customer options.

Steps 200 and 202 are obtaining the necessary files for the netlist generation. For the customer option, these are GENNET.LIS, the logic netlist file 12; DESIGN.BOV, the bias driver identification file 18; DESIGN.MVA, the I/O macro pulldown resistor file 19; and XXAUTOPIN.S50, the pad-I/O signal relationship file 20, which are obtained from the conventional design and layout sequence 30. The system resident files are the files of the skeleton library 34 (hereinafter "*.SK"); and the files of the subcircuit library (hereinafter "SUBCKT.MDL"). Libraries 34 and 36 are obtained as discussed above. File CHIP.DEF is obtained manually by coding the actual coordinates of every pad of the chip as measured from an actual array plot.

Step 204 is the creation of netlist generation system input files for the customer option. The files GENNET.LIS, DESIGN.BOV, DESIGN.MVA, and XXAUTOPIN.S50 simply are copied and renamed OPTION_GENNET.LIS, OPTION_DES.BOV, OPTION.MVA, and OPTION_APIN.S50, where "OPTION" is the name of the customer option.

Steps 206 and 208 are executed by the program AUTOIO.C;52, which is listed in part 1 of the Appendix. In step 206, OPTION CHIP.IO files are generated. These files specify the external pin I/O signal names for the customer option. In step 208, the format of file OPTION APIN.S50 is modified; the character "-" is substituted for the character "/" in accordance with the signal name convention used in the netlist generation system.

Program GET_TOKEN is a line parser that skips over blank Spaces and tab delimiters, and returns a valid token of a text line. Program MASKNAME masks out old I/O signal names from XXAUTOPIN.S50 with new I/O signal names. Program READS50 generates a new S50 file with correct signal names.

Programs GET_TOKEN (Part 7 of the Appendix), MASKNAME (Part 8 of the Appendix), and READS50 (Part 18 of the Appendix) are sub-programs called by program AUTOIO as needed.

Step 210 is executed by the program DEFGEN (Part 2 of the Appendix), which generates the text file OPTION.DEF specifying the physical coordinate of each I/O signal and power pad in the customer option. This information is used in appending the I/O signal names to their respective pads in the physical data base of the customer option. The input files to program DEFGEN are OPTION_CHIP.IO, OPTION_APIN.S50, CHIP.DEF, and the skeleton library files 34.

Step 212 is executed by the program FIXGENNET (Part 3 of the Appendix), which creates an output file OPTION_GEN.LIS that is similar to file OPTION_GENNET.LIS modified by extracting two specific macro types that are not relevant to the netlist generating step 32. These macro types, IN00X2/3 and OUT00X2/3, physically represent only a piece of metal layer. The input files to program FIXGENNET are OPTION_CHIP.IO, OPTION_GENNET.LIS, and the skeleton library files 34.

Step 214 is executed by the program NEWGENNET. Note that a different NEWGENNET program is used for each type of array, although the functions performed by the programs are identical. Programs NEWGENNET_4K, NEWGENNET_13K, NEWGENNET_14K, and NEWGENNET_14KRAM are used for 4K arrays, 1.3K arrays, 14K arrays, and 14K arrays with RAM respectively, and are listed in Parts 14, 15, 16 and 17 respectively of the Appendix. Program NEWGENNET generates a complete logic netlist of the customer option suitable for the circuit level netlist generating system by adding the I/O connectivity netlist information and the bias driver connectivity information for the customer option to the file OPTION_GEN.LIS. The input files to program NEWGENNET are OPTION_GEN.LIS, OPTION_CHIP.IO, OPTION_DES.BOV, and the skeleton library files 34.

Step 216 is executed by program GENBIO (Part 4 of the Appendix), which defines for each macro instance the names of the utilized inputs, the names of the utilized outputs, the base power of the macro instance, the output power of each of the utilized outputs, and the names of the inputs and outputs that are not utilized. This information is stored in file OPTION_INST.DAT. Another output file called OPTION_LAY.BOV containing external slave bias identification and overlay utilization information is generated also. The input files to the program GENBIO are OPTION_NGEN.LIS and the skeleton library files 34.

Step 218 is executed by program GENMDL. Note that a different GENMDL program is used for each type of array, although the functions performed by the programs are identical. Program GENMDL_4K is used for 4K and 1.3K arrays, while program GENMDL.14K is used for 14K arrays and 14K arrays with RAM. Programs GENMDL_4K AND GENMDL_14K are listed in Parts 5 and 6 respectively of the Appendix. Program GENMDL generates a MDL circuit level netlist for every macrocell instance in the customer option by providing the appropriate base skeleton file and appending the appropriate I/O skeleton files for each macrocell instance, as specified by the macrocell instance. These netlists are collected in file OPTION_MAC.MDL. Program GENMDL also generates file OPTION_IPIN.DAT containing I/O pin information suitable for determining the connectivity between the various macrocell instances in the customer option. The input files for program GENMDL are OPTION_INST.DAT, OPTION_NGEN.LIS, OPTION_LAY.BOV and the skeleton library files 34.

Step 220 is executed by program MERGEMDL. Note that a different MERGEMDL program is used for each type of array, although the functions performed by the programs are identical. Programs MERGEMDL_4K, MERGEMDL_13K, MERGEMDL_14K, and MERGEMDL_14KRAM are used for 4K arrays, 1.3K arrays, 14K arrays, and 14K arrays with RAM respectively, and are listed in Parts 10, 11, 12 and 13 respectively of the Appendix. Program MERGEMDL completes the circuit level MDL netlist by adding connectivity information to the collection of MDL circuit level netlists for every macrocell instance in the customer option. A working file called OPTION_INET.MDL specifying the signal connectivity between macro instances is created. The complete netlist, which now contains MDL netlists for each instance and specifies the connectivity between the various instances, is further supplemented by subcircuit MDL files, which are merely appended from file SUBCKT.MDL, the subcircuit library 36. The resulting file is OPTION.MDL. The input files for program MERGEMDL are OPTION_IPIN.DAT, OPTION_MAC.MDL, SUBCKT.MDL, and OPTION_NGEN.LIS.

Step 222 completes a check on the file OPTION.MDL. An electrical rules check is performed to ensure that the connections are properly made, and a further check is made to ensure that no typographical or syntactical errors are present. Suitable software is available for executing step 222 on workstations or general purpose computers, and includes the ERC ("Electrical Rule Check") software system available from Silvar Lisco Inc.

Verification of Physical Connectivity

In the comparison step 38, the circuit schematic netlist file 36 is compared against the physical database 24 to determine whether the physical connectivity of the overlay files agrees with the physical connectivity as dictated by the circuit level netlist 36. One approach to implementing the comparison step 38 is on a workstation or general purpose computer using a suitable software program. Suitable comparison software includes the "Layout versus Schematic" system (hereinafter "LVS (Trademark) system") available from Cadence Design Systems, Inc., and the "Network Consistency Check" system (hereinafter "NCC (Trademark) system") available from Silvar-Lisco Corporation of Santa Clara, Calif.

Figure 28:
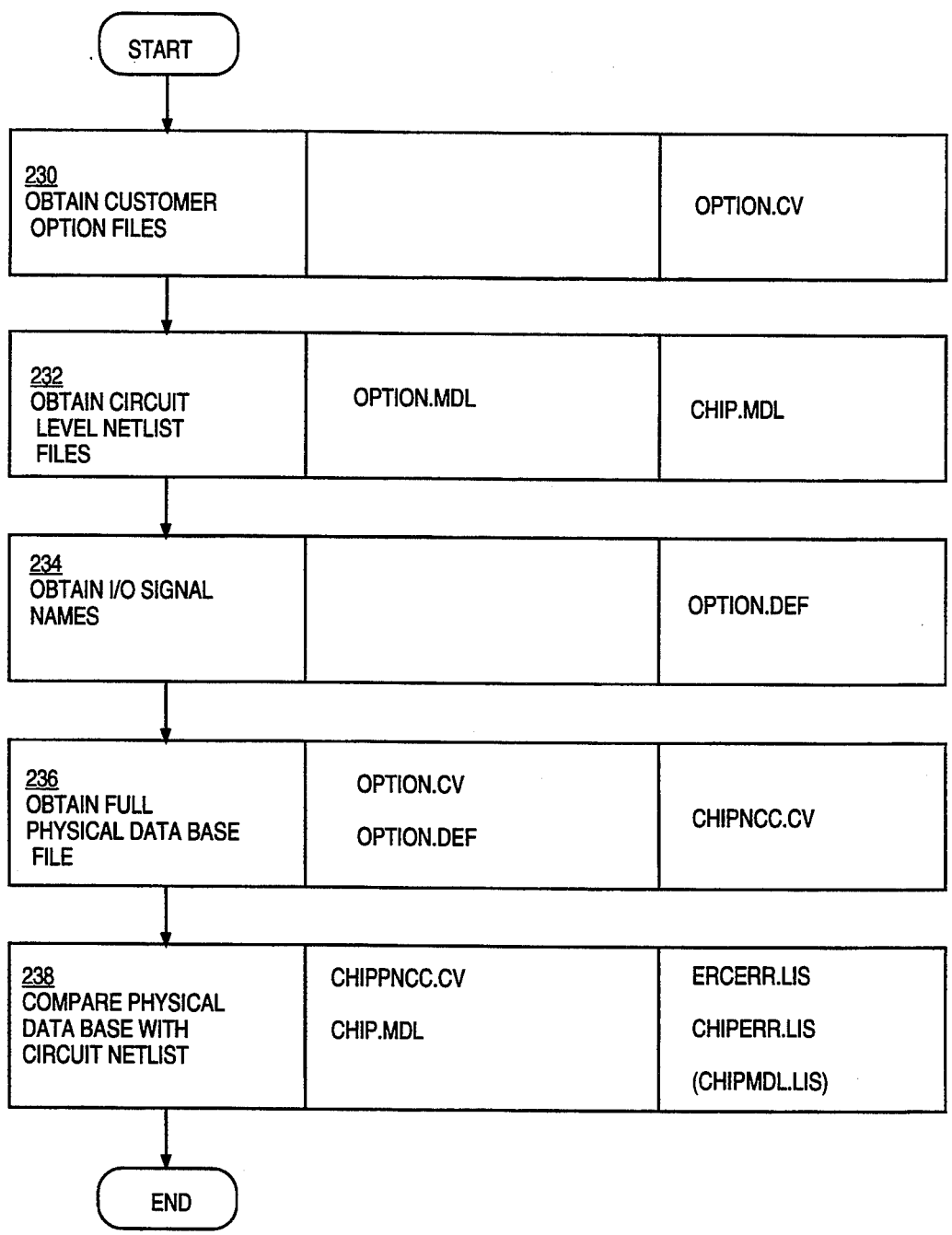
FIGS. 28-29 are flow diagrams of two different computer programs for performing the comparison step of FIG. 2.

FIG. 28 illustrates the comparison step 38 when performed with the Network Consistency Check system. Several principal input files are used. The physical data base file 24 for the customer option is obtained in step 230. This file name is OPTION.CV, which is one of three file formats available from the design and layout sequence 30. The circuit level netlist 36 is obtained in step 232. File OPTION.MDL is the name of the circuit level netlist obtained as discussed above, and for the purposes of the comparison step 38 the file is copied and renamed CHIP.MDL. To enable the I/O signal names to be appended to their respective pads in the physical data base of the customer option, the text file OPTION.DEF specifying the physical coordinate of each I/O signal and power pad in the customer option is obtained in step 234. File OPTION.DEF is generated in step 210 by the program DEFGEN, as discussed above. The file OPTION.DEF is appended to the customer option physical data base file OPTION.CV in step 236 to form the file CHIPNCC.CV, which is the full physical data base file, including the I/O signal name text, for the customer option.

The physical data base for the customer option, as represented by file CHIPNCC.CV, is compared with the circuit netlist file for the entire customer option, as represented by file CHIP.MDL, in step 238. The comparison is performed by the NCC software, in accordance with procedures established by Silvar-Lisco Corporation and set forth in its manuals. The NCC software generates an intermediate file CHIPMDL.LIS, which is essentially the same as file CHIP.MDL except that it contains line numbers for the purpose of debugging. This intermediate file is useful for entering the NCC system at an intermediate point, provided that the full NCC system is run at least once, that other intermediate files from the NCC system are not tampered with, and that only the OPTION.MDL file is modified (files OPTION.CV and OPTION.DEF are original).

The files ERCERR.LIS and CHIPERR.LIS are generated in step 238. File ERCERR.LIS specifies if any power pads are shorted in the OPTION.CV file due to errors in the customer option or in the OPTION.DEF file. File CHIPERR.LIS is the error report specifying the discrepancies, if any, between the OPTION.MDL and the OPTION.CV files. Files ERCERR.LIS and CHIPERR.LIS are analyzed in accordance with the Electrical Rules Check Users Manual and the Network Consistency Check User Guide, which are available from Silvar-Lisco Corporation.

Figure 29:
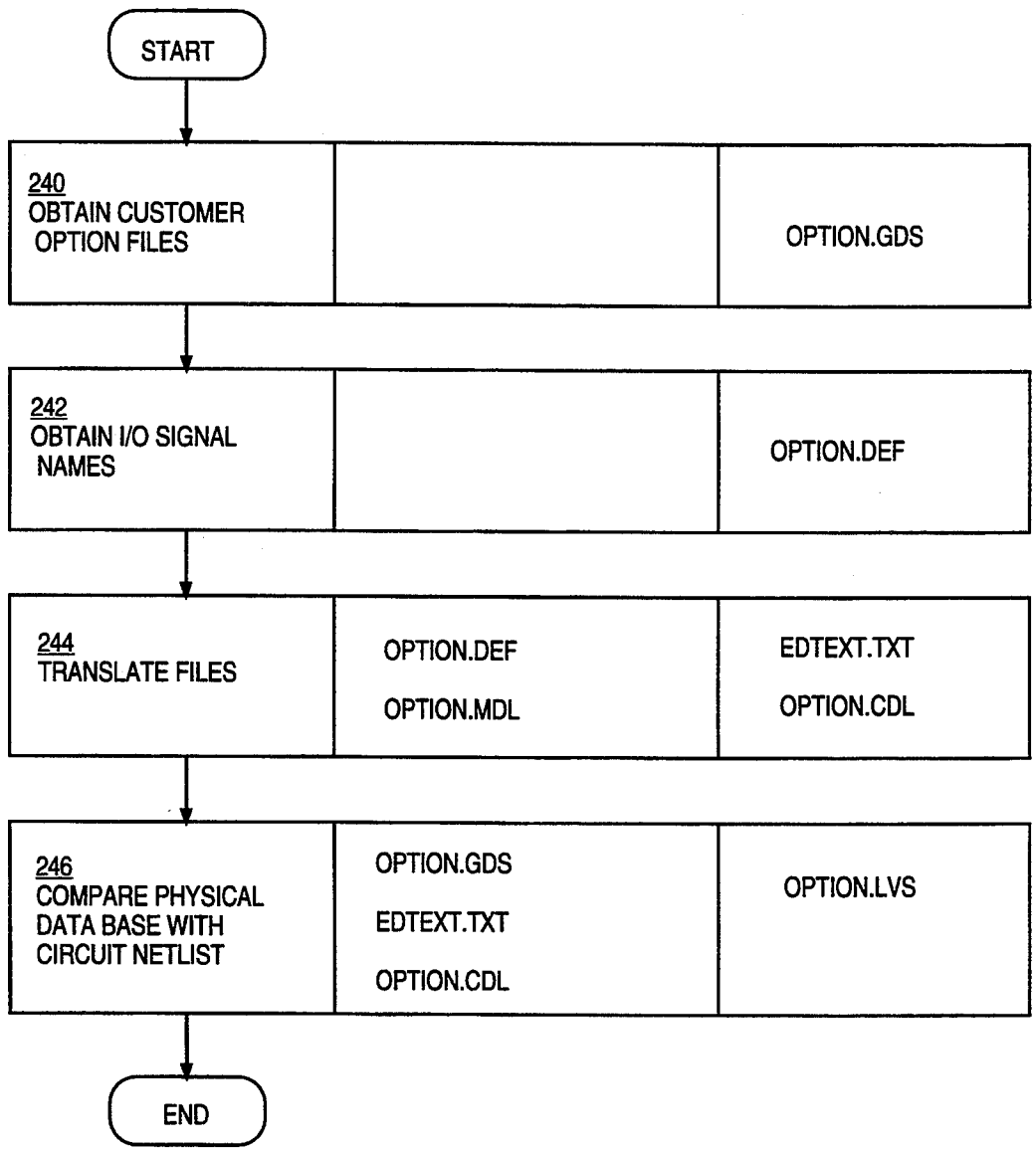

FIG. 29 illustrates the comparison step 38 when performed with the Layout versus Schematic system. Several principal input files are used. The physical database file 24 for the customer option is obtained in step 240. This file name is OPTION.GDS, one of three different formats available from the design and layout sequence 30. To enable the I/O signal names to be appended to their respective pads in the physical database of the customer option, the text file OPTION.DEF specifying the physical coordinate of each I/O signal and power pad in the customer option is obtained in step 242. File OPTION.DEF is generated in step 210 by the program DEFGEN, as discussed above.

Figures 30, 30G:
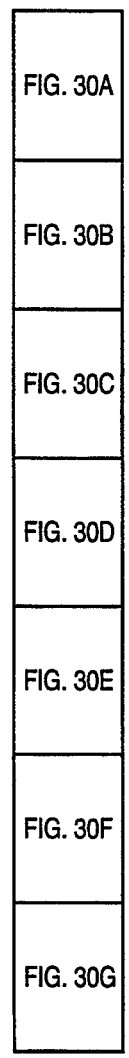
FIGS. 30A-30F are listings of program ED-TEXT.TXT.

As the circuit netlist file OPTION.MDL generated in step 220 is written in the MDL format, translation of the netlist file 36 from the MDL format to the CDL (Trademark) format recognized by Cadence Design Systems, Inc. software is performed in step 244. The program MDL2CDL.C listed in Part 9 of the Appendix is suitable for performing this conversion. Also in step 244, file OPTION.DEF is converted to file EDTEXT.TXT, using the program DEF2KTXT, which is listed in FIG. 30.

The physical database for the customer option, which is obtained from input files OPTION.GDS and EDTEXT.TXT, is compared with the circuit netlist file for the entire customer option, which is obtained from input file OPTION.CDL, in step 246. The comparison is performed by the LVS software, in accordance with procedures established by Cadence Design Systems, Inc. and set forth in its DRAFULA I & II User Manual. The output file OPTION.LVS is the error report specifying the discrepancies, if any, between the customer option and the circuit netlist generated for the option. File OPTION.LVS is analyzed in accordance with the DRACULA I & II User's Manual.

While our invention has been described with respect to the embodiments set forth above, other embodiments and variations not described herein are within the scope of our invention. For example, our invention should not be limited to any particular computer, file structure, or computer language. Accordingly, other embodiments and variations not described herein are to be considered within the scope of our invention as defined by the following claims.

What is claimed is:

1. A computer-performed method for generating a circuit level netlist from a logic design of an application specific integrated circuit, comprising the steps of:
    collecting files defined by reoccurring combinations of components present in a set of macrocells into a first set of files, the macrocells of the macrocell set corresponding to logic elements available for use in the design;
    deriving a second set of files corresponding to the macrocells of the macrocell set, wherein the component combinations are represented in high level symbology;
    deriving a logic netlist that identifies macrocell instances in the design and defines the connectivity therebetween; and
    constructing a circuit level netlist of the design from the logic netlist, the first set of files, and the second set of files.

2. A method as in claim 1, wherein the step of deriving a second set of files corresponding to the macrocells of the macrocell set comprises the steps of:
    identifying input and output circuits used in the macrocells of the macrocell set; and
    omitting occurrences of the identified input and output circuits from the second set of files;
    the method further comprising the step of collecting files corresponding to the identified input and output circuits into a third set of files; and the circuit level netlist construction step further comprising the step of constructing a circuit level netlist of the design from the third set of files.

3. A method as in claim 2, wherein the identified input and output circuits are user programmable.

4. A computer-performed method for generating a circuit level netlist from a logic design of an application specific integrated circuit, comprising the steps of:
    collecting files corresponding to high level components present in a set of macrocells corresponding to a set of logic elements available for use in the design to form a subcircuit library;
    deriving a skeleton file library that includes a set of base skeleton files corresponding to the macrocells of the macrocell set, and a set of input and output skeleton files corresponding to the input and output circuits used in the macrocells of the macrocell set;
    deriving a logic netlist that identifies macrocell instances in the design and defines the connectivity therebetween; and
    constructing a circuit level netlist of the design from the logic netlist, the skeleton file library, and the subcircuit library.

5. A method as in claim 4, wherein the skeleton file library deriving step comprises the steps of:
    identifying programmable input and output circuits present in the macrocells of the macrocell set;
    collecting the identified programmable input and output circuits in a nonredundant manner to form the set of input and output skeleton files;
    removing input and output circuits corresponding to the identified programmable input and output circuits from the macrocells of the macrocell set to form a set of redefined macrocells; and
    expressing the redefined macrocells in terms of standard components and high level components.

6. A method as in claim 4, wherein the circuit level netlist construction step comprises the steps of:
    constructing a circuit level description for each macrocell instance in the logic level netlist;
    specifying connectivity between macrocell instances; and
    appending the subcircuit library.

7. A method as in claim 6, wherein the step of constructing a circuit level description for each macrocell instance comprises the steps of:
    copying the base skeleton file that corresponds to the macrocell instance; and
    appending the input and output skeleton files identified by the macrocell instance.

8. A method as in claim 4, further comprising the steps of:
    deriving a bias driver identification file;
    deriving an I/O macro pulldown resistor definition file; and
    deriving a pad-to-I/O signal relation definition file;
    and wherein the construction step further comprises the step of constructing the circuit level netlist from the bias driver identification file, the I/O macro pulldown resistor definition file, and the paid-I/O signal relation definition file.

9. A computer-performed method for checking the connectivity of a physical data base file for a design of an application specific integrated circuit, comprising the steps of:
    collecting files defined by reoccurring combinations of components present in a set of macrocells into a first set of files, the macrocells of the macrocell set corresponding to logic elements available for use in the design;
    deriving a second set of files corresponding to the macrocells of the macrocell set, wherein the component combinations are represented in high level symbology;

deriving a logic netlist that identifies macrocell instances in the design and defines the connectivity therebetween;

constructing a circuit level netlist of the design from the logic netlist, the first set of files, and the second set of files; and comparing the physical data base with the circuit level netlist to determine the connectivity of the physical data base.

10. A computer-performed method for checking the connectivity of a physical data base file for a design of an application specific integrated circuit, comprising the steps of:

collecting files corresponding to high level components present in a set of macrocells corresponding to a set of logic elements available for use in the design to form a subcircuit library;

deriving a skeleton file library that includes a set of base skeleton files corresponding to the macrocells of the macrocell set, and a set of input and output skeleton files corresponding to the input and output circuits use in the macrocells of the macrocell set;

deriving a logic netlist that identifies macrocell instances in the design and defines the connectivity therebetween;

constructing a circuit level netlist of the design from the logic netlist, the skeleton file library, and the subcircuit library; and comparing the physical data base with the circuit level netlist to determine the connectivity of the physical data base.

11. A computer-performed method of generating a circuit level netlist, comprising the steps of:

collecting representations of combinations of electrical components reoccurring in a set of macrocells into a first set of representations, the macrocells of the macrocell set corresponding to logic elements available for use in designing an application specific integrated circuit;

deriving a second set of representations of the macrocells of the macrocell set in accordance with the component combinations of the first set of representations;

receiving a logic netlist from a design of an application specific integrated circuit, the logic netlist identifying macrocell instances in the design and defining interconnectivities between the macrocell instances;

for each of the identified macrocell instances, providing a corresponding one of the representations of the second set of representations to construct a circuit level description thereof; and applying the defined interconnectivities to specify connectivity between the circuit level descriptions.

* * * * *

UNITED STATES PATENT AND TRADEMARK OFFICE
CERTIFICATE OF CORRECTION

PATENT NO.    :   5,384,710
DATED         :   January 24, 1995
INVENTOR(S)   :   Nim C. Lam and Amrit K. Lalchandani It is certified that errors appear in the above-identified patent and that said Letters Patent is hereby corrected as shown below:

Column 10, line 41, delete "off" and insert --of--.

Column 12, line 5, delete "OPTION CHIP.IO" insert -- OPTION_CHIP.IO--.

Column 12, line 8, between "TION" and "APIN.S50" insert --_--.

Column 12, line 9, delete "/" and insert --\--.

Column 13, line 6, delete "GENMDL 4K" and insert -- GENMDL_4K--.

Signed and Sealed this

Twentieth Day of February, 1996

Attest:

BRUCE LEHMAN

Attesting Officer    Commissioner of Patents and Trademarks